(12) United States Patent
Zhou et al.

(10) Patent No.: US 6,677,245 B2
(45) Date of Patent: Jan. 13, 2004

(54) CONTACT STRUCTURE PRODUCTION METHOD

(75) Inventors: Yu Zhou, Libertyville, IL (US); David Yu, Bloomingdale, IL (US); Robert Edward Aldaz, Carol Stream, IL (US); Theodore A. Khoury, Evanston, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/195,673

(22) Filed: Jul. 13, 2002

(65) Prior Publication Data

US 2002/0179904 A1 Dec. 5, 2002

Related U.S. Application Data

(63) Continuation of application No. 09/663,434, filed on Sep. 16, 2000, now Pat. No. 6,504,223, and a continuation-in-part of application No. 09/503,903, filed on Feb. 14, 2000, now Pat. No. 6,540,524, which is a continuation-in-part of application No. 09/201,299, filed on Nov. 30, 1998, now Pat. No. 6,297,164.

(51) Int. Cl.⁷ ............................................. H01L 21/302
(52) U.S. Cl. ...................... 438/708; 438/720; 438/723
(58) Field of Search ................................ 438/708, 720, 438/723, 742, 750; 216/20

(56) References Cited

U.S. PATENT DOCUMENTS

| | | | | | |
|---|---|---|---|---|---|
| 5,486,483 | A | * | 1/1996 | Lammert | 438/666 |
| 5,527,766 | A | * | 6/1996 | Eddy | 505/410 |
| 5,772,451 | A | | 6/1998 | Dozier, II et al. | |
| 5,800,184 | A | | 9/1998 | Lopergolo et al. | |
| 5,919,050 | A | | 7/1999 | Kehley et al. | |
| 5,926,951 | A | * | 7/1999 | Khandros et al. | 29/843 |
| 5,998,228 | A | * | 12/1999 | Eldridge et al. | 438/15 |
| 6,072,190 | A | * | 6/2000 | Watanabe et al. | 257/48 |
| 6,252,415 | B1 | * | 6/2001 | Lefever et al. | 324/761 |
| 6,278,284 | B1 | | 8/2001 | Mori et al. | |
| 6,356,098 | B1 | | 3/2002 | Akram et al. | |

* cited by examiner

Primary Examiner—Nadine G. Norton
Assistant Examiner—Binh X. Tran
(74) Attorney, Agent, or Firm—Muramatsu & Associates

(57) ABSTRACT

A method for producing a contact structure for establishing electrical connection with contact targets. The contact structure is formed of a contact substrate and a plurality of contactors. The contactor has a tip portion at one end of the contactor to contact with the contact target, a base portion at another end of the contactor which is inserted in a through hole provided on the contact substrate in such a way that an end of the contactor functions as a contact pad for electrical connection at a surface of the contact substrate, and a spring portion provided between the tip portion and the base portion which produces a contact force when the contactor is pressed against the contact target.

20 Claims, 25 Drawing Sheets

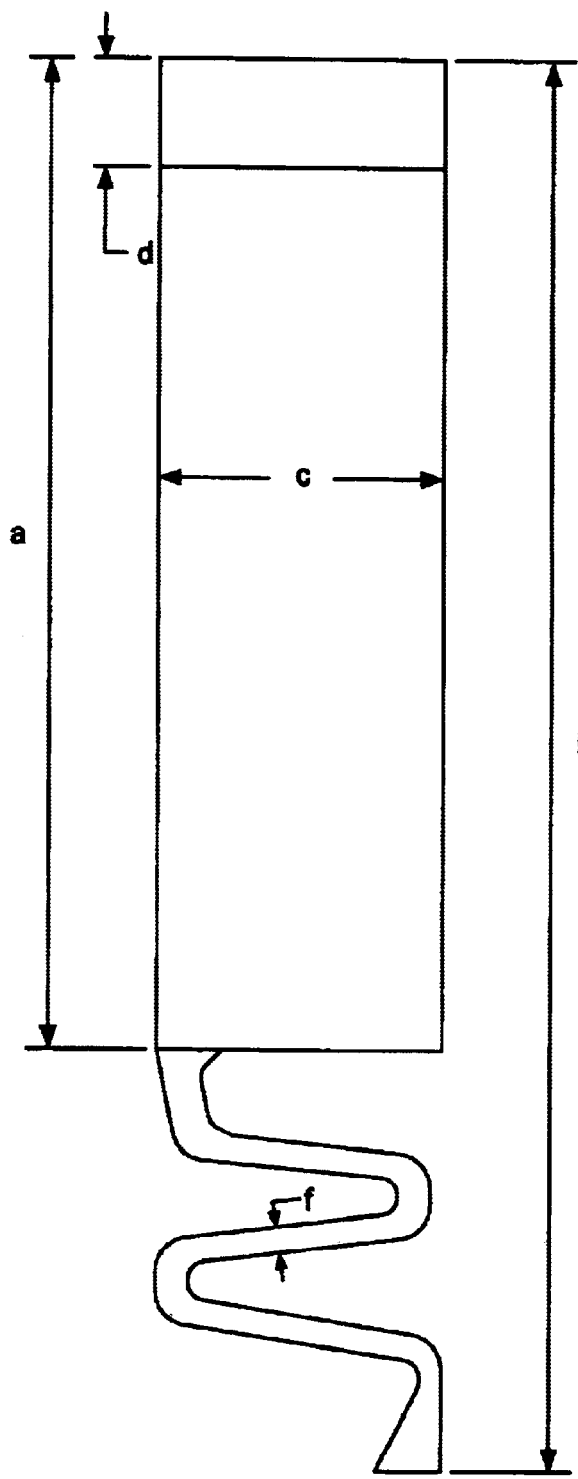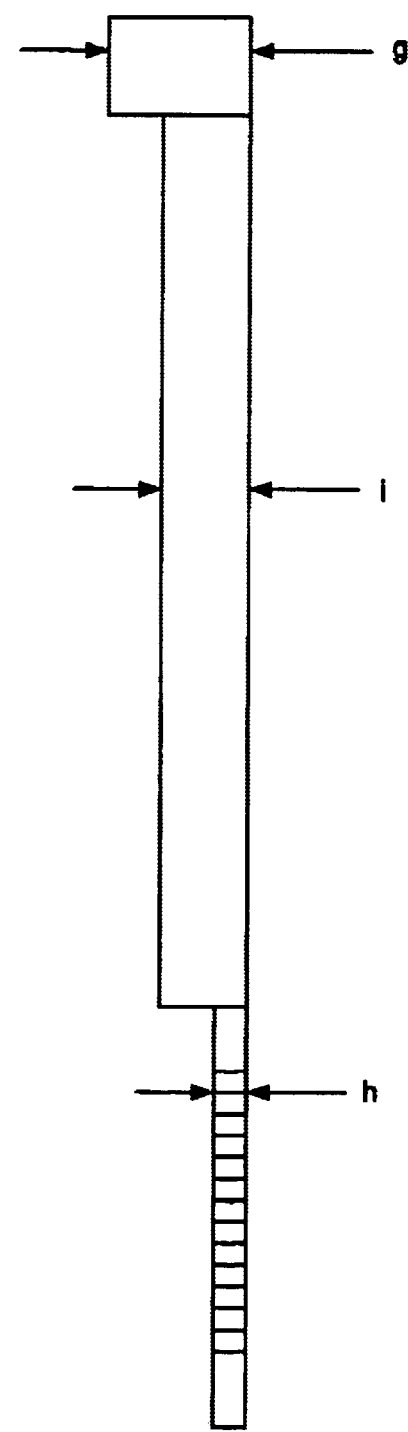

Fig. 14A
Fig. 14B
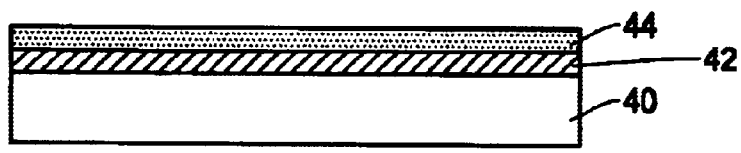
Fig. 14C
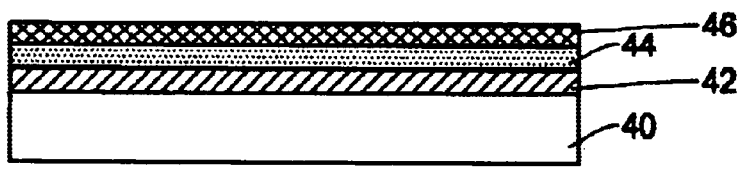
Fig. 14D
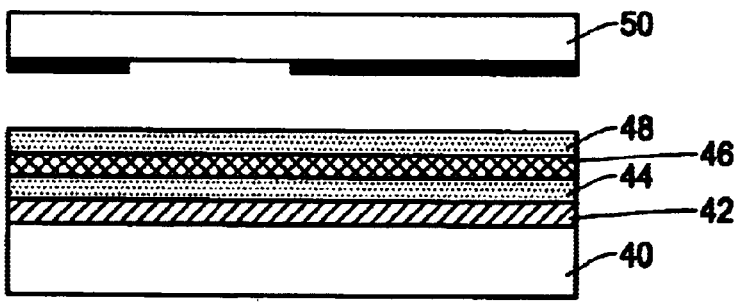

Fig. 18
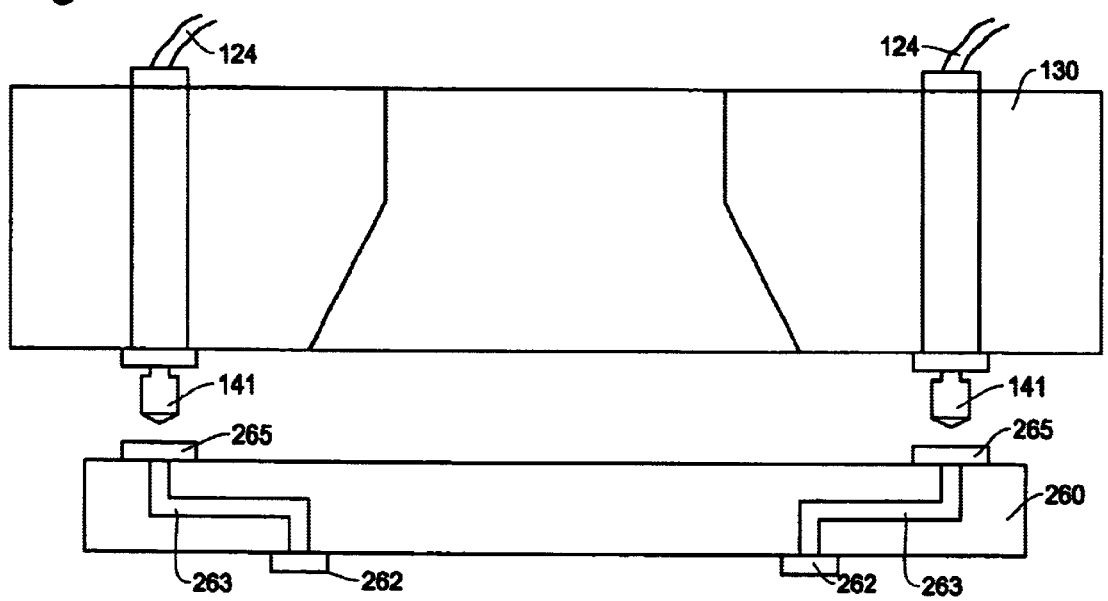
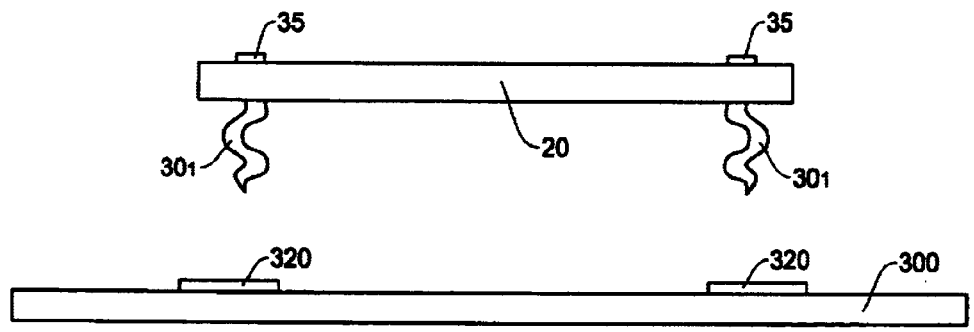

US 6,677,245 B2

CONTACT STRUCTURE PRODUCTION METHOD

This is a continuation of U.S. patent application Ser. No. 09/663,434 filed Sep. 16, 2000, now U.S. Pat. No. 6,504,223 which is a continuation-in-part of U.S. patent application Ser. No. 09/201,299 filed Nov. 30, 1998 now U.S. Pat. No. 6,297,164 and U.S. patent application Ser. No. 09/503,903 filed Feb. 14, 2000 now U.S. Pat. No. 6,540,524.

FIELD OF THE INVENTION

This invention relates to a contact structure and a production method thereof and a probe, contact assembly using the contact structure, and more particularly, to a contact structure having a large number of contactors in a vertical direction and to a method for producing such a large number of contactors on a semiconductor wafer in a horizonal direction and removing the contactors from the wafer to be mounted on a substrate in a vertical direction to form the contact structure such as a contact probe assembly, probe card, IC chip, or other contact mechanism.

BACKGROUND OF THE INVENTION

In testing high density and high speed electrical devices such as LSI and VLSI circuits, a high performance contact structure such as a probe card having a large number of contactors must be used. In other applications, contact structures may be used for IC packages as leads or terminals. The present invention is directed to such contact structures to be used in testing LSI and VLSI chips, semiconductor wafers, burn-in of semiconductor wafers and dice, testing and burn-in of packaged semiconductor devices, printed circuit boards and the like. The present invention can also be applicable to other purposes such as leads or terminal pins of IC chips, IC packages or other electronic devices. However, for the convenience of explanation, the present invention is described mainly with reference to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the frog ring 130. The contact pins 141 are also connected to the contact terminals 121 of the performance board 120 with the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact target) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps (contact targets) on the wafer 300. The ends of the cantilevers 190 are connected to wires 194 which are further connected to transmission lines (not shown) formed in the probe card 170. The transmission lines are connected to a plurality of electrodes (contact pads) 197 which are in communication with the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, the strip (impedance matched) line 196, the wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth. Thus, there is a need of a contact structure with a new concept which can satisfy the requirement in the next generation semiconductor test technology.

SUMMARY OF THE INVENTION

Therefore, it is an object of the present invention to provide a contact structure having a large number of contactors for electrically contacting contact targets with a high frequency bandwidth, high pin counts and high contact performance as well as high reliability.

It is another object of the present invention to provide a contact structure such as a probe card to establish electrical connection for testing semiconductor devices and the like, having a very high frequency bandwidth to meet the test requirements in the next generation semiconductor test technology.

It is a further object of the present invention to provide a contact structure to establish electrical connection in applications such as testing semiconductor devices, which are suitable for testing a large number of semiconductor devices in parallel at the same time.

It is a further object of the present invention to provide a contact structure and its assembly mechanism for assembling a plurality of contact structures to form a probe contact assembly of desired size with desired number of contactors mounted on the probe contact assembly.

It is a further object of the present invention to provide a method for producing a large number of contactors in a two dimensional manner on a silicon substrate, removing the contactors from the substrate and mounting the contactors on a contact substrate in a three dimensional manner to form a contact structure.

It is a further object of the present invention to provide a method for producing a large number of contactors in a two dimensional manner on a silicon substrate, transferring the contactors to an adhesive tape and removing the contactors therefrom for vertically mounting the same on a contact substrate to form a contact structure.

In the present invention, a contact structure for testing (including burn-in) a semiconductor wafers, packaged LSIs or printed circuit boards (devices under test) are formed of a large number of contactors produced on a planar surface of a silicon substrate by a photolithography technology established in the semiconductor production process. The contact structure of the present invention can also be used as components of electronics devices such as IC leads and pins.

The first aspect of the present invention is a contact structure for establishing electrical connection with contact targets. The contact structure is formed of a contact substrate and a plurality of contactors in which each of the contactors has a substantially straight shape. The contactor is comprised of a tip portion which is protruded in a vertical direction to form a contact point, a base portion which is inserted in a through hole provided on the contact substrate in such a way that an end of the contactor functions as a contact pad for electrical connection at a bottom surface of the contact substrate, and a spring portion provided between the tip portion and the base portion which produces a contact force when the contactor is pressed against the contact target.

Another aspect of the present invention is a method of producing the contactors in a two dimensional manner on a silicon substrate and removing therefrom for establishing a contact structure. The production method is comprised of the following steps of:

(a) forming a sacrificial layer on a surface of a silicon substrate;

(b) forming a photoresist layer on the sacrificial layer;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming a first layer of contactors made of electric conductive material in the patterns on the photoresist layer by an electroplating process;

(f) repeating the steps (b)–(e) above on the first layer of contactors to form a second layer or higher layer of the contactors;

(g) stripping the photoresist layer off;

(h) removing the sacrificial layer by an etching process so that the contactors are separated from the silicon substrate; and (i) mounting the contactors on a contact substrate having through holes to receive ends of the contactors therein so that at least one end of each of the contactors functions as a contact pad for electric connection.

A further aspect of the present invention is another method of producing the contactors in a two dimensional manner on a silicon substrate and transferring the contactors to the adhesive tape and removing therefrom for establishing a contact structure. The production method is comprised of the following steps of:

(a) forming a sacrificial layer on a surface of a substrate;

(b) forming a photoresist layer on the sacrificial layer on the substrate;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming the a first layer of contactors made of electric conductive material in the patterns on the photoresist layer by an electroplating process;

(f) repeating the steps (b)–(e) above on the first layer of contactors to form a further layer of the contactors;

(g) stripping the photoresist layer off;

(h) placing an adhesive tape on the contactors so that upper surfaces of the contactors are attached to the adhesive tape;

(i) removing the sacrificial layer by an etching process so that the contactors on the adhesive tape are separated from the silicon substrate; and (j) mounting the contactors on a contact substrate having through holes to receive therein ends of the contactors wherein at least one end of each of the contactors function as a pad for electric connection.

A further aspect of the present invention is a method of producing the contactors in a two dimensional manner on a silicon substrate and transferring the contactors to the adhesive tape. The production method is comprised of the following steps of:

(a) forming an conductive substrate made of electric conductive material on a dielectric substrate;

(b) forming a photoresist layer on the conductive substrate;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming a first layer of contactors made of electric conductive material in the patterns on the photoresist layer by an electroplating process;

(f) repeating the steps (b)–(e) above on the first layer of contactors to form a further layer of the contactors;

(g) stripping off the photoresist layer;

(h) peeling the conductive substrate having contactors thereon from the dielectric substrate;

(i) placing an adhesive tape on the contactors on the conductive substrate so that upper surfaces of the contactors adhere to the adhesive tape wherein adhesive strength between the contactors and the adhesive tape is larger than that between the contactors and the conductive substrate;

(j) peeling the conductive substrate so that the contactors on the adhesive tape are separated from the conductive substrate; and (k) mounting the contactor on a contact substrate having a through hole in such a way the an end of the contactor is projected from an opposite surface of the contact substrate.

A further aspect of the second present invention is a probe contact assembly including the contact structure of the present invention. The probe contact assembly is formed of a contact substrate having a plurality of contactors mounted on a surface thereof, a probe card for mounting the contact substrate and establishing electrical communication between the contactors and electrodes provided on the probe card, and a pin block having a plurality of contact pins to interface between the probe card and a semiconductor test system when the pin block is attached to the probe card.

The contactors are mounted vertically on a horizontal surface of the contact substrate where each of the contactors has a substantially straight shape. Each contactor is comprised of a tip portion which is protruded in a vertical direction to form a contact point, a base portion which is inserted in a corresponding through hole on the contact substrate, and a spring portion provided between the tip portion and the base portion which produces a resilient contact force when the contact structure is pressed against the contact target. The spring portion has a curved, inclined, meander or zig-zag shape to exert the contact force, and an upper surface of the base portion is projected from the surface of the contact substrate and functions as a contact pad for electrical connection with an external component.

According to the present invention, the contact structure has a very high frequency bandwidth to meet the test requirements of next generation semiconductor technology. Since the large number of contactors are produced at the same time on the substrate without involving manual handling, it is possible to achieve consistent quality, high reliability and long life in the contact performance as well as low cost. Further, because the contactors are assembled on the same substrate material as that of the device under test, it is possible to compensate positional errors caused by temperature changes.

Further, according to the present invention, the production process is able to produce a large number of contactors in a horizontal direction on the silicon substrate by using relatively simple technique. Such contactors are removed from the substrate and mounted on a contact substrate in a vertical direction. The contact structure produced by the present invention are low cost and high efficiency and have high mechanical strength and reliability.

BRIEF DESCRIPTION OF THE DRAWINGS

FIGS. 10A and 10B are diagrams showing a specific example of contactor of the present invention wherein FIG. 10A is a front view of the contactor and FIG. 10B is a side view of the contactor.

FIGS. 11A and 11B are diagrams showing another specific example of contactor of the present invention wherein FIG. 11A is a front view of the contactor and FIG. 11B is a side view of the contactor.

FIGS. 12A and 12B are diagrams showing a further specific example of contactor of the present invention wherein FIG. 12A is a front view of the contactor and FIG. 12B is a side view of the contactor.

FIGS. 13A and 13B are diagrams showing a further specific example of contactor of the present invention wherein FIG. 13A is a front view of the contactor and FIG. 13B is a side view of the contactor.

FIGS. 14A–14L are schematic diagrams showing an example of production process in the present invention for producing the contactors.

FIG. 18 is a cross sectional view showing an example of probe contact assembly using the contact structure of the present invention as an interface between a semiconductor device under test and a test head of a semiconductor test system.

DETAILED DESCRIPTION OF THE PREFERRED EMBODIMENT

Figure 5:
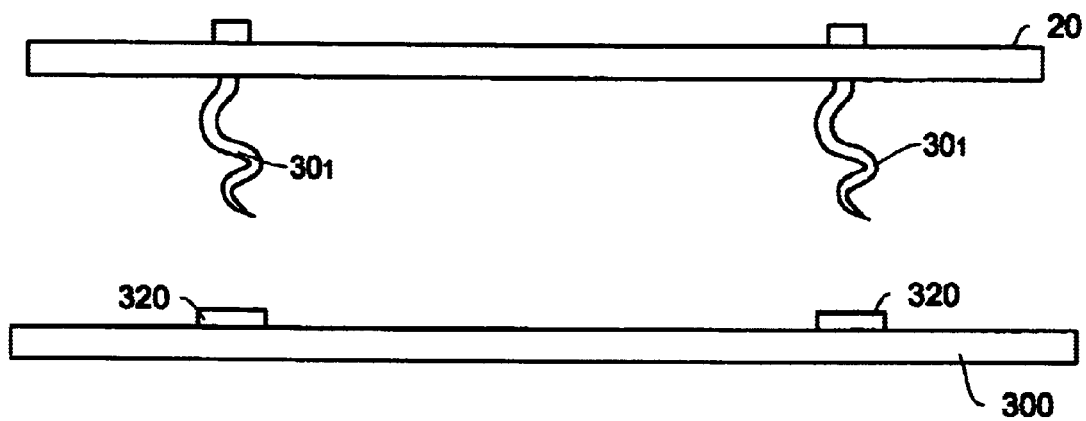
FIG. 5 is a schematic diagram showing an example of contact structure of the present invention using contactors produced in a horizontal direction on a silicon substrate and vertically mounted on a contact substrate.
Figure 6:
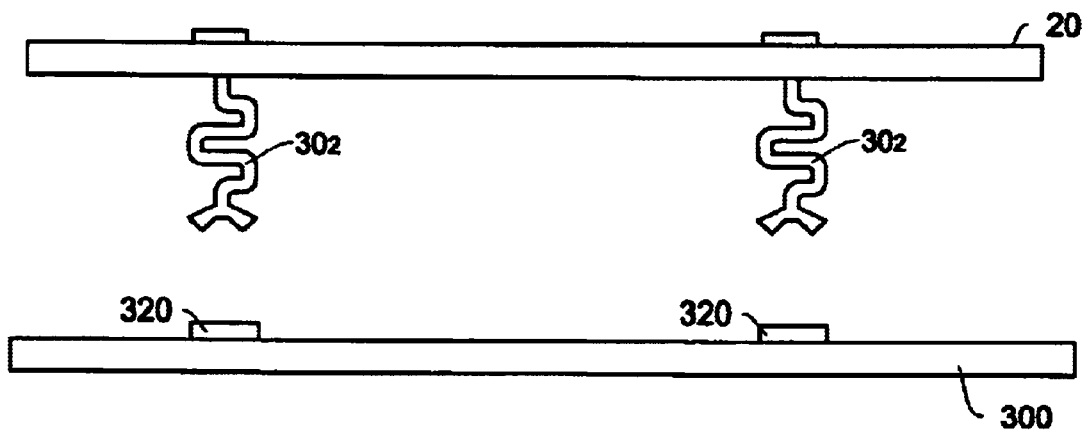
FIG. 6 is a schematic diagram showing another example of contact structure of the present invention using contactors produced in a horizontal direction on a silicon substrate and vertically mounted on a contact substrate.
Figure 7:
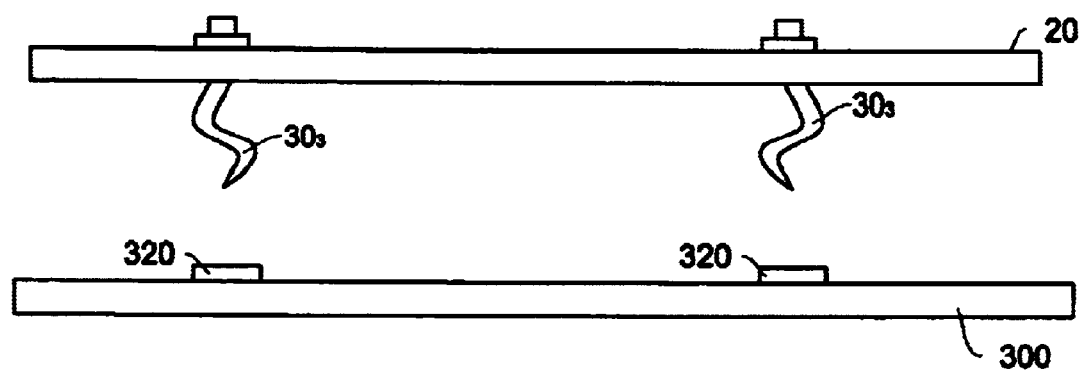
FIG. 7 is a schematic diagram showing a further example of contact structure of the present invention using contactors produced in a horizontal direction on a silicon substrate and vertically mounted on a contact substrate.

FIGS. 5–7 show examples of contact structure of the present invention. Each contact structure is configured by a contact substrate 20 and contactors 30. In the example of FIG. 5, each contactor $30_1$ extends substantially in a vertical direction and is formed of a base portion which is connected to the contact substrate 20, a contact point which is preferably sharpened, and a meander shaped portion between the base portion and the contact point to function as a contact spring.

In the example of FIG. 6, each contactor $30_2$ extends substantially in the vertical direction and is formed of a base portion connected to the contact substrate 20, a contact point which is split into two or more points and preferably sharpened, and a zig-zag shaped portion between the base portion and the contact point to function as a contact spring.

In the example of FIG. 7, each contactor $30_3$ extends substantially in the vertical direction having a hook like shape and is formed of a base portion connected to the contact substrate 20, a contact point which is preferably sharpened and is oriented in the vertical direction, and a curved portion between the base portion and the contact point to function as a contact spring.

Each of the contactors 30 of FIGS. 5–7 produces contact pressure by a spring force derived mainly from the horizontally curved portion, i.e., the meander shaped, zig-zag shaped or curved portion of the contactor, when the contact structure is pressed against contact pads 320 on a semiconductor wafer or printed circuit board 300. The contact pressure also creates a scrubbing effect at the tip of the contactor (contact point) against the surface of contact pad 320. Such a scrubbing effect promotes an improved contact performance when the contact point scrubs the oxide surface of the contact pad 320 to electrically contact the conductive material of the contact pad 320 under the oxide surface.

It should be noted that, the contactors $30_1$, $30_2$ and $30_3$ can be interchangeably used and produced in accordance with the present invention, although the contact structure and its production method will be described with respect to only one or two of the contactors. Further, various other types of contactors of the present invention will also be described later with reference to FIGS. 9–13, although the detailed description will be made only on limited types of contactors. Since the contactors of the present invention shown in FIGS. 5–7 and 9–13 are vertically mounted, rather than an inclined fashion, on the horizontal surface of the contact substrate, a large number of contactors can be mounted in the limited space on the contact substrate.

Figure 8A:
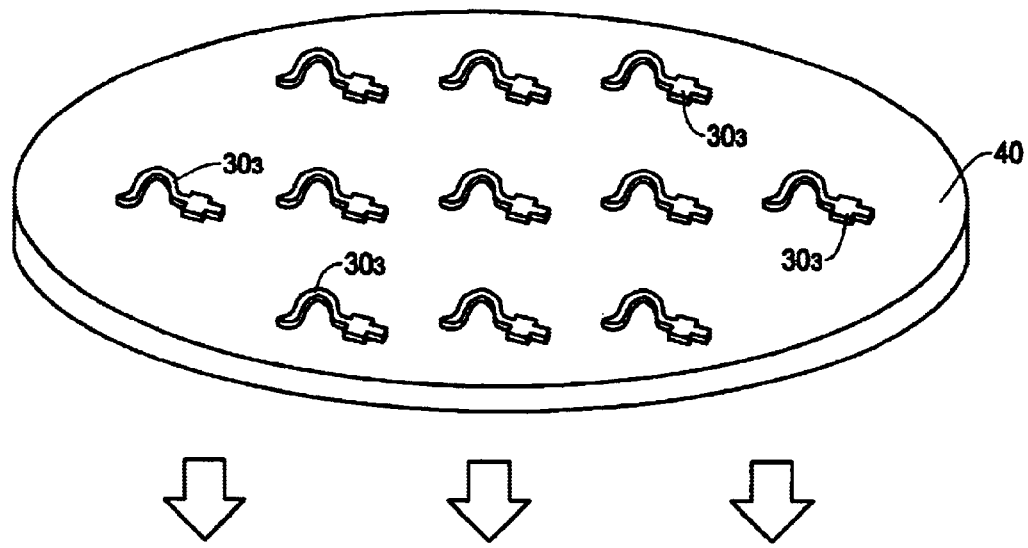
FIGS. 8A and 8B are schematic diagrams showing basic concepts of production method of the present invention in which a large number of contactors are formed on a planar surface of a silicon substrate and removed therefrom for later processes.
Figure 8B:
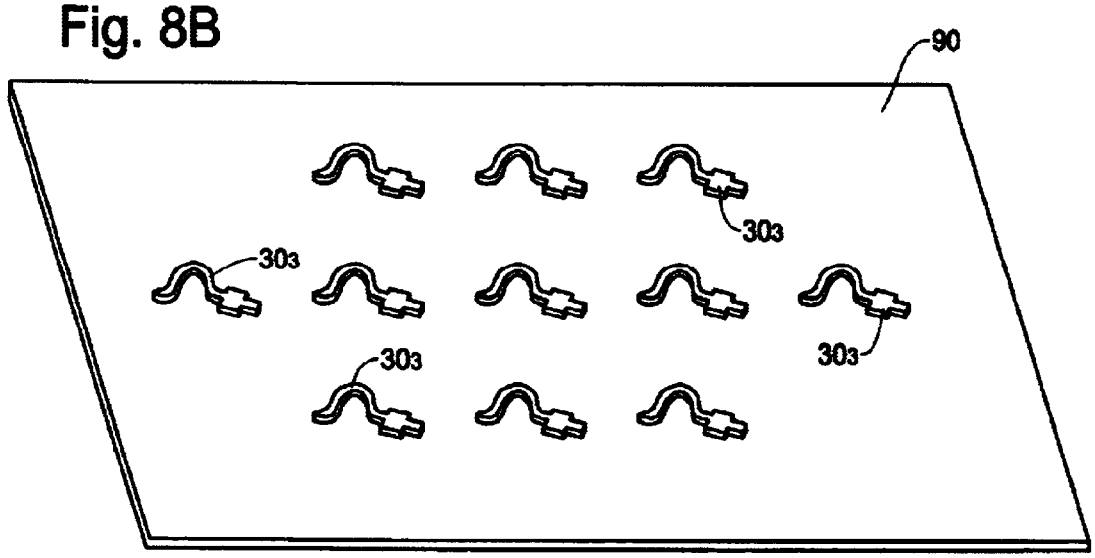
Figure 9A:
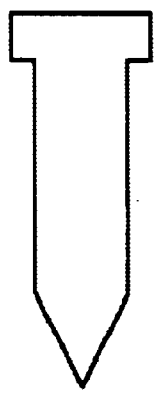
FIGS. 9A–9I are schematic diagrams showing examples of shape in contactors to be produced in the production process of the present invention and to be used in the contact structures of the present invention.
Figure 9B:
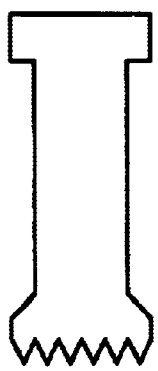
Figure 9C:
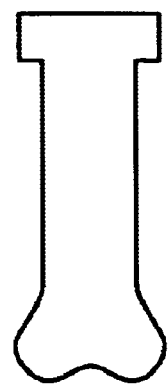
Figure 9D:
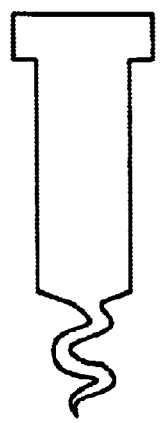
Figure 9E:
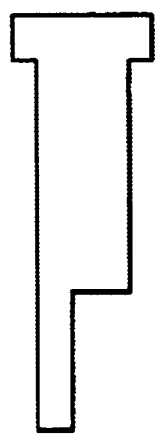
Figure 9F:
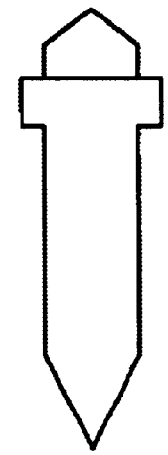
Figure 9G:
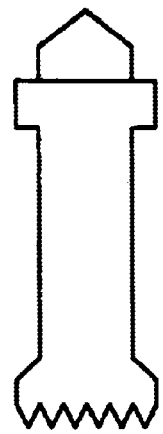
Figure 9H:
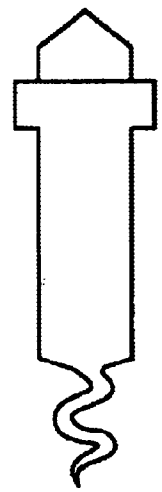
Figure 9I:
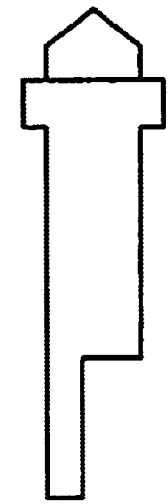

FIGS. 8A–8B show basic ideas of the present invention for producing such contactors. In the present invention, as shown in FIG. 8A, contactors 30 are produced on a planar surface of a substrate 40 which is a silicon substrate or other dielectric substrate in a horizontal direction, i.e., in a two dimensional manner. Then, the contactors 30 are removed from the substrate 40 to be mounted on the contact substrate 20 of FIGS. 5–7 such as a printed circuit board, IC chip, or other contact mechanism in a vertical direction, i.e., in a three dimensional manner.

In the example of FIG. 8, the contactors 30 produced on a planar surface of a silicon or other dielectric substrate 40 in a horizontal direction are transferred from the substrate 40 to an adhesive member 90, such as an adhesive tape, adhesive film or adhesive plate (collectively "adhesive tape" or "intermediate plate"). The contactors 30 on the adhesive tape are removed therefrom to be mounted on a contact substrate 20 of FIGS. 5–7 such as a printed circuit board, IC chip, or other contact mechanism in a vertical direction, i.e., in a three dimensional manner with use of a pick and place mechanism.

FIGS. 9A–9I show examples of various shapes of the contactors of the present invention to be mounted on the contact substrate in the manner shown in FIGS. 5–7. The examples of FIGS. 9A–9E have a flat base at one end to be protruded from the upper surface of the contact substrate 20 of FIGS. 5–7 and a contact tip at the other end. The contact tips of FIGS. 9A–9E have various shapes to contact with the surface of the contact target with low contact resistance. The example of FIG. 9D has a spring like contact tip to achieve elasticity in the vertical direction. In forming a probe assembly, a conductive elastomer may be preferably used to produce a resilient spring force or elasticity in the vertical direction when the contactors contact the contact targets as will be described with reference to FIGS. 19 and 20.

The examples of FIGS. 9F–9I have a triangle top on the base to be projected from the upper surface of the contact substrate 20 of FIGS. 5–7. Each of the contactors of FIGS. 9A–9I are substantially straight as a whole and is mounted substantially vertically relative to the horizontal surface of the contact substrate. Similar to the examples of FIGS. 9A–9E, the contact tips of FIGS. 9F–9I have various shapes to contact with the surface of the contact target with low contact resistance. In forming a probe assembly, a conductive elastomer may be preferably used to produce a spring force or elasticity in the vertical direction when the contactors contact the contact targets as will be described with reference to FIG. 19.

Figure 10A:
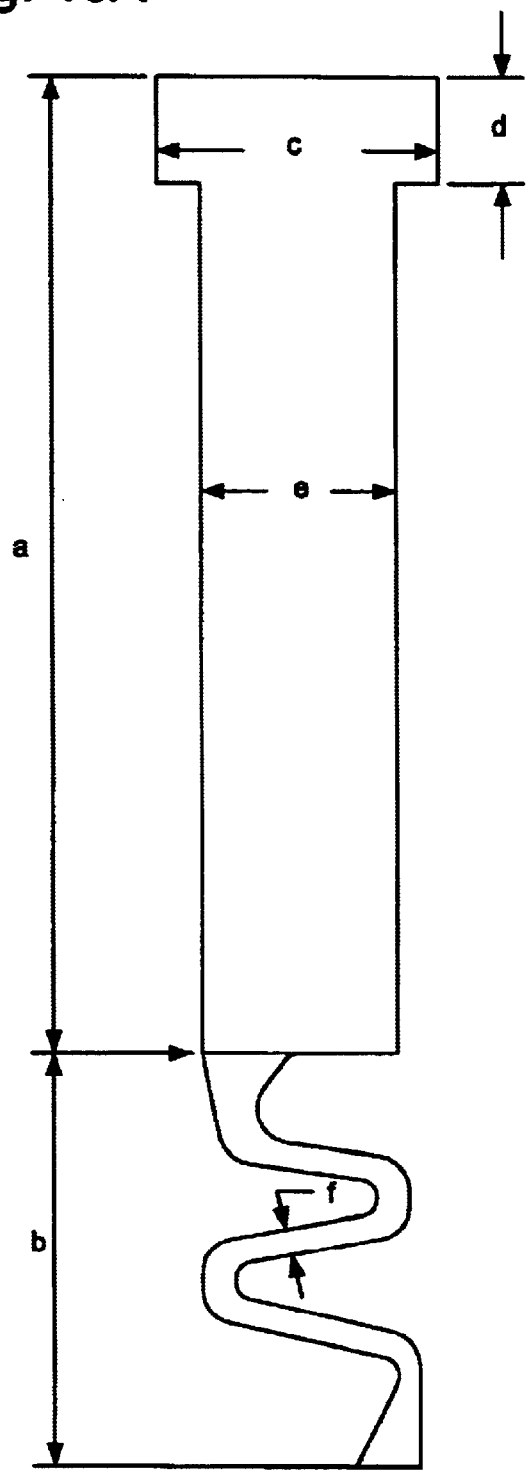
Figure 10B:
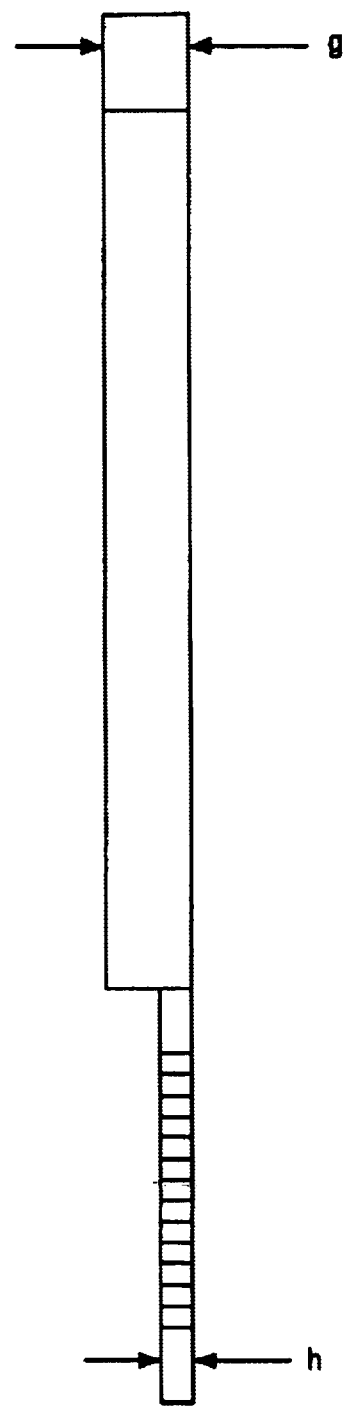

FIGS. 10A and 10B show a specific example of contactor of the present invention wherein FIG. 10A is a front view and FIG. 10B is a side view thereof. The contactor of FIG. 10 has a base portion with an upper end to be protruded from the upper surface of the contact substrate 20 of FIGS. 5–7 when mounted thereon, a contact portion at a lower end having a contact point to contact the surface of the contact target, and a straight body portion between the base portion and the contact portion to be inserted in the contact substrate 20 of FIGS. 5–7. The contact portion is meander or zig-zag shaped to function as a spring when pressed against the contact target.

In the front view of FIG. 10A, the base portion is extended in the right and left direction. In the side view of FIG. 10B, the contact portion is sized thinner than the straight body portion or the base portion to be easily deformed, thereby exerting the resilient spring force when pressed against the contact target. Because of the two different thickness, i.e, the thinner area for the contact portion and the thicker area for the body and base portions, conductive materials are deposited two or more times to form two layers or more in the production process of the contactor. An example of sizes of the contactor of FIG. 10 is: a=1050.0 $\mu$m, b=330.0 $\mu$m, c=200.0 $\mu$m, d=50.00 $\mu$m, e=150.00 $\mu$m, f=20.00 $\mu$m, g=50.00 $\mu$m, and h=20.00 $\mu$m.

FIGS. 11A and 11B are diagrams showing another specific example of contactor of the present invention wherein FIG. 11A is a front view and FIG. 11B is a side view thereof. The contactor of FIG. 11 has a base portion with an upper end to be protruded from the upper surface of the contact substrate 20 of FIGS. 5–7 when mounted thereon, a contact portion at a lower end having a contact point to contact the surface of the contact target, and a straight body portion between the base portion and the contact portion to be inserted in the contact substrate 20 of FIGS. 5–7. The contact portion is meander or zig-zag shaped to function as a spring when pressed against the contact target.

Figure 19:
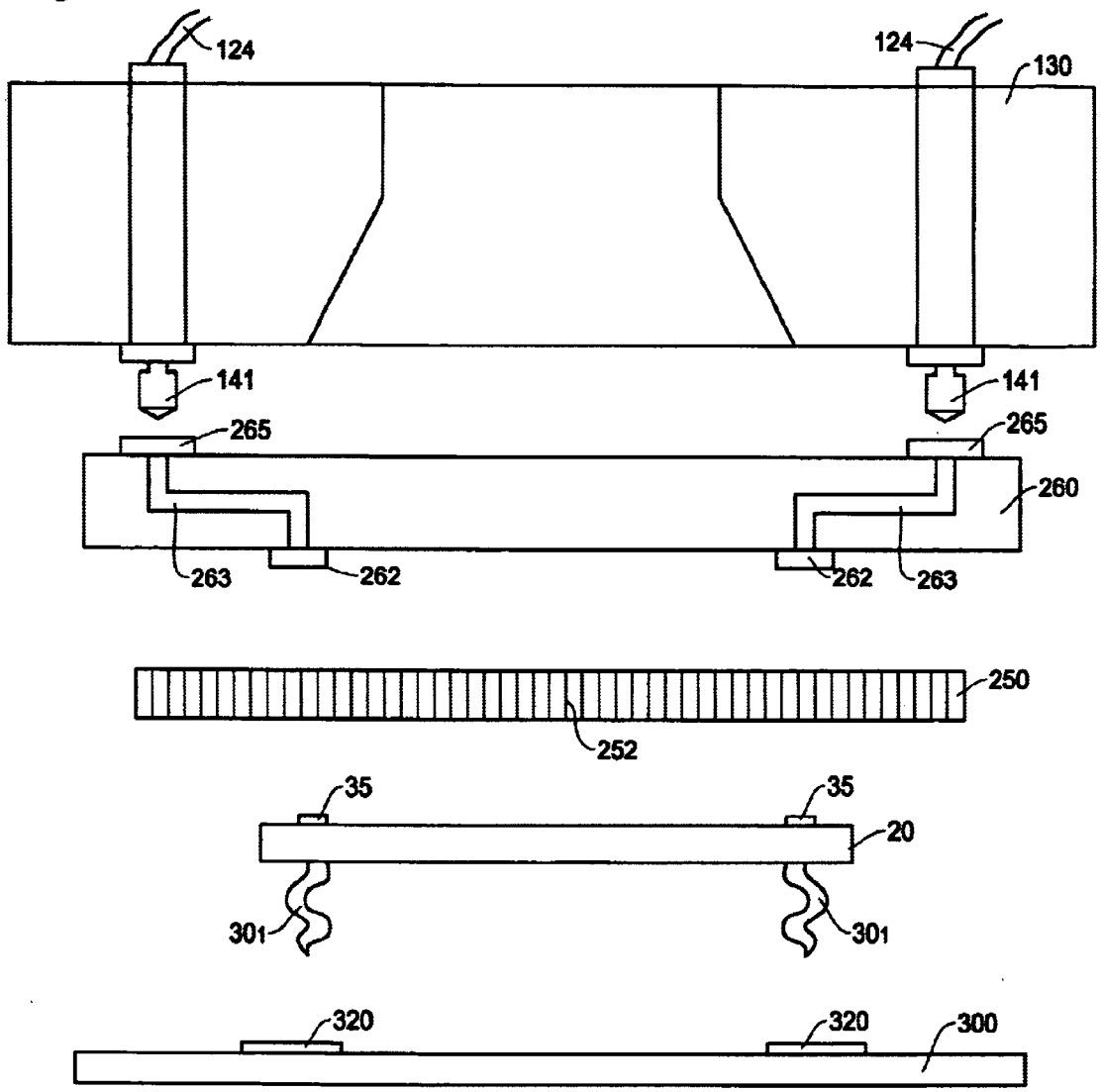
FIG. 19 is a cross sectional view showing another example of probe contact assembly using the contact structure of the present invention as an interface between a semiconductor device under test and a test head of a semiconductor test system.
Figure 20:
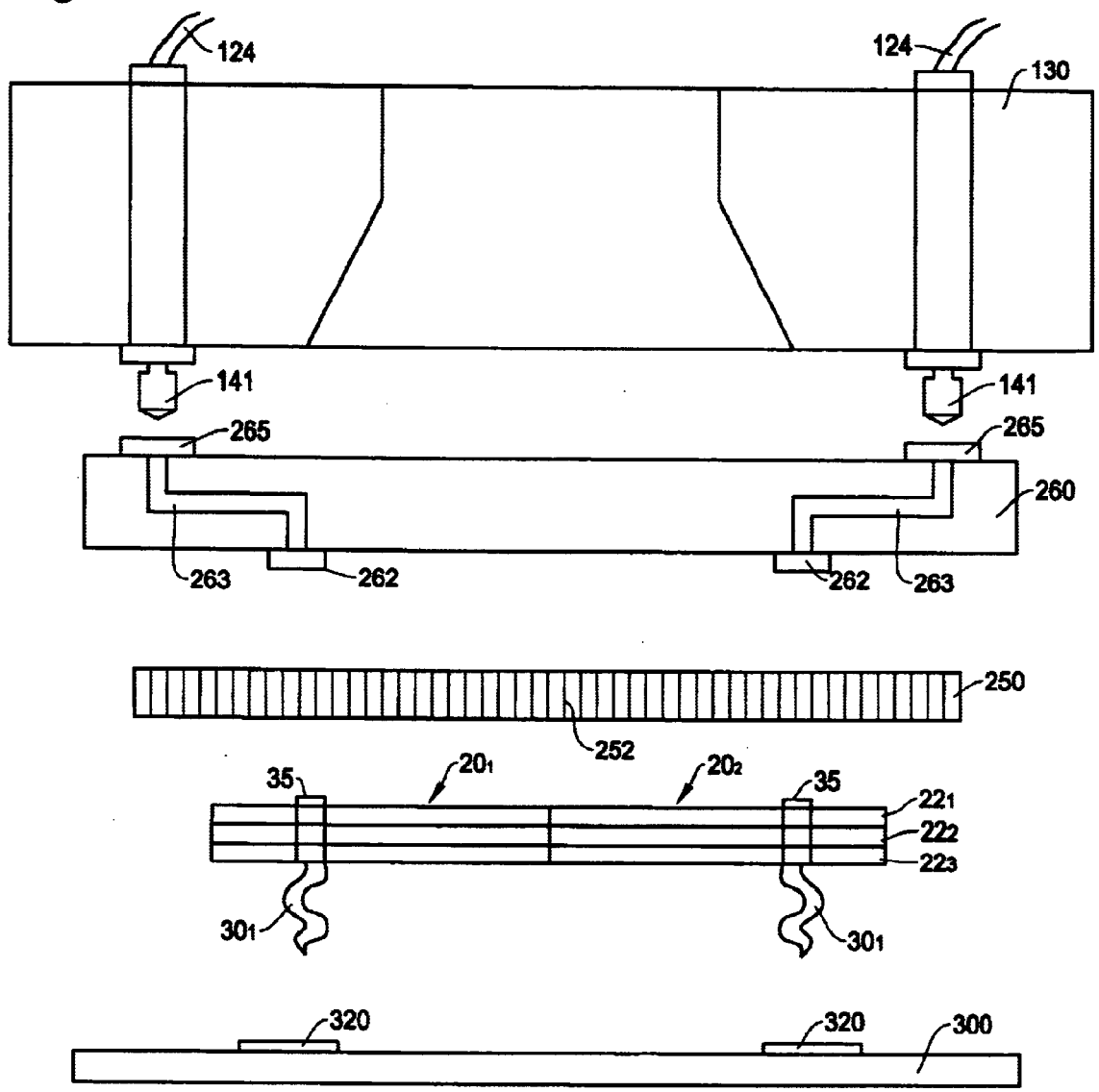
FIG. 20 is a cross sectional view showing a further example of probe contact assembly using the contact structure of the present invention as an interface between a semiconductor device under test and a test head of a semiconductor test system.

In the side view of FIG. 11B, the base portion has the largest thickness to increase a top area to contact with external components such as a probe card shown in FIGS. 18–20. Also in the side view of FIG. 11B, the contact portion is sized thinner than the straight body portion or the base portion to be easily deformed, thereby exerting the spring force when pressed against the contact target. Because involving the three different thickness, i.e, first thickness for the contact portion, second thickness for the body portion, and third thickness for the base portions, conductive materials may be deposited three times or more in the production process of the contactor. An example of sizes of the contactor of FIG. 11 is: a=1000.00 $\mu$m, b=1,330.00 $\mu$m, c=200.00 $\mu$m, d=50.00 $\mu$m, f=20.00 $\mu$m, g=80.00 $\mu$m, h=20.00 $\mu$m, and i=50.00 $\mu$m.

Figure 12A:
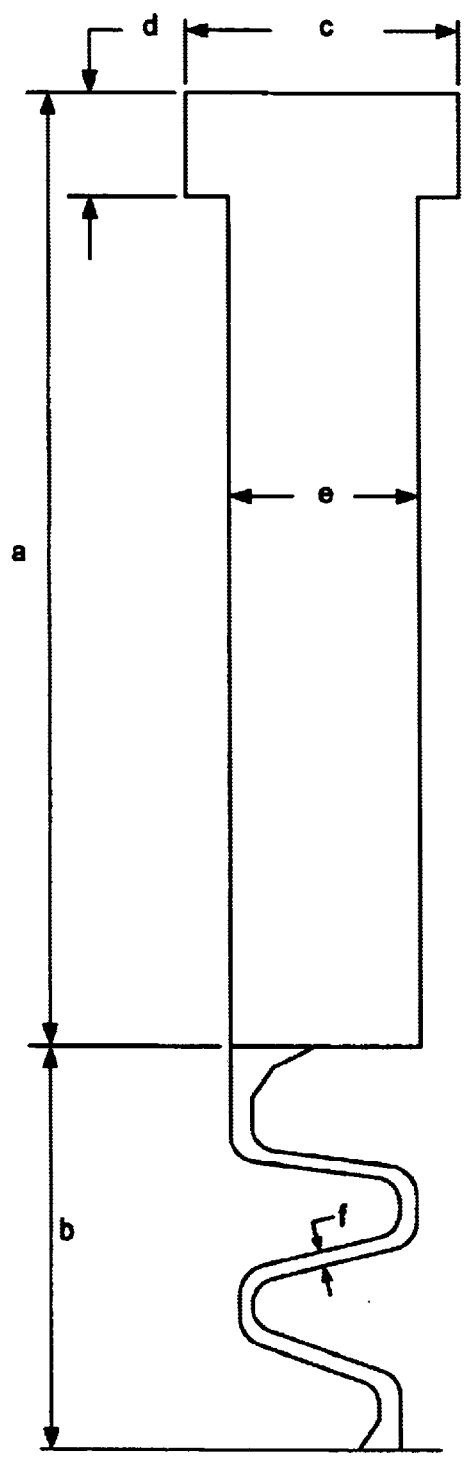
Figure 12B:
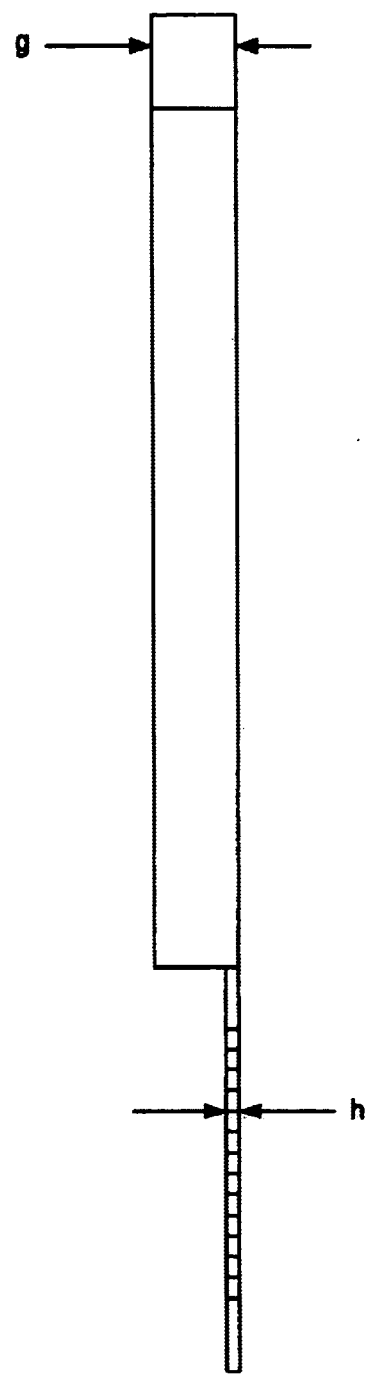

FIGS. 12A and 12B are diagrams showing a further specific example of contactor of the present invention wherein FIG. 12A is a front view and FIG. 12B is a side view thereof. The contactor of FIG. 12 has a base portion with an upper end to be protruded from the upper surface of the contact substrate 20 of FIGS. 5–7 when mounted thereon, a contact portion at a lower end having a contact point to contact the surface of the contact target, and a straight body portion between the base portion and the contact portion to be inserted in the contact substrate 20 of FIGS. 5–7. The contact portion is meander or zig-zag shaped to function as a spring when pressed against the contact target.

In the front view of FIG. 12A, the base portion is extended in the right and left direction. In the side view of FIG. 12B, the contact portion is sized thinner than the straight body portion or the base portion to be easily deformed, thereby exerting the resilient spring force when pressed against the contact target. The thickness of the contact portion of this example is much smaller than that of the examples of FIGS. 10 and 11. Because involving the two different thickness, i.e, conductive materials can be deposited two or more times to form two or more layers of conductive material in the production process of the contactor. An example of sizes of the contactor of FIG. 12 is: a=1050.00 $\mu$m, b=330.00 $\mu$m, c=200.00 $\mu$m, d=50.00 $\mu$m, e=150.00 $\mu$m, f=10.00 $\mu$m, g=50.00 $\mu$m, and h=10.00 $\mu$m.

Figure 13A:
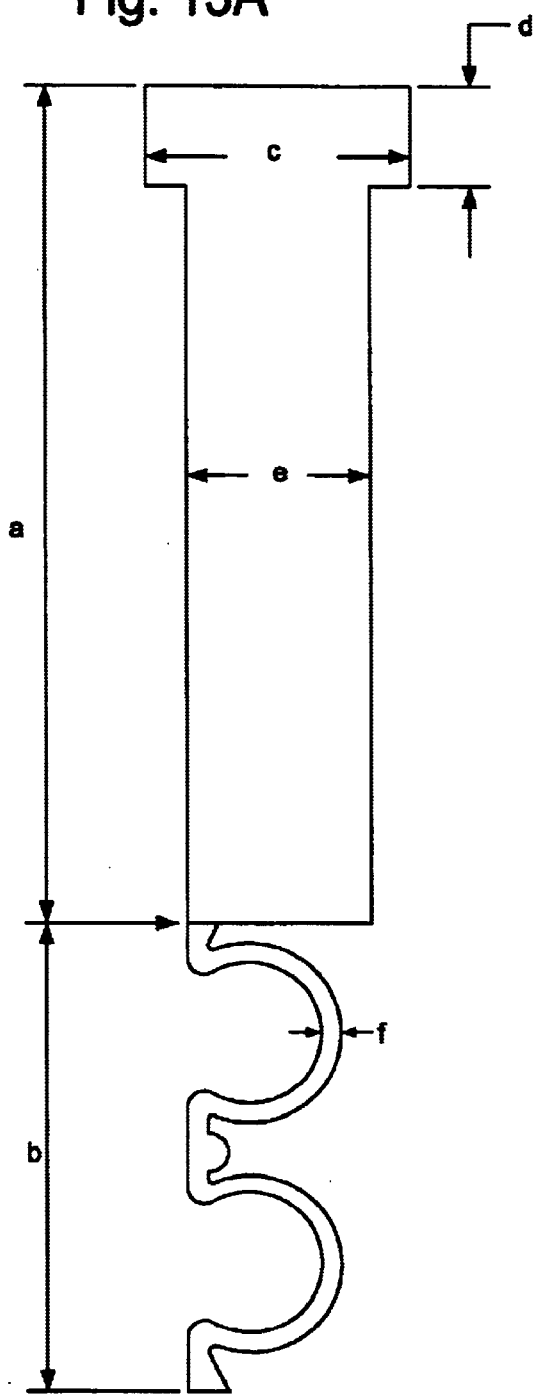
Figure 13B:
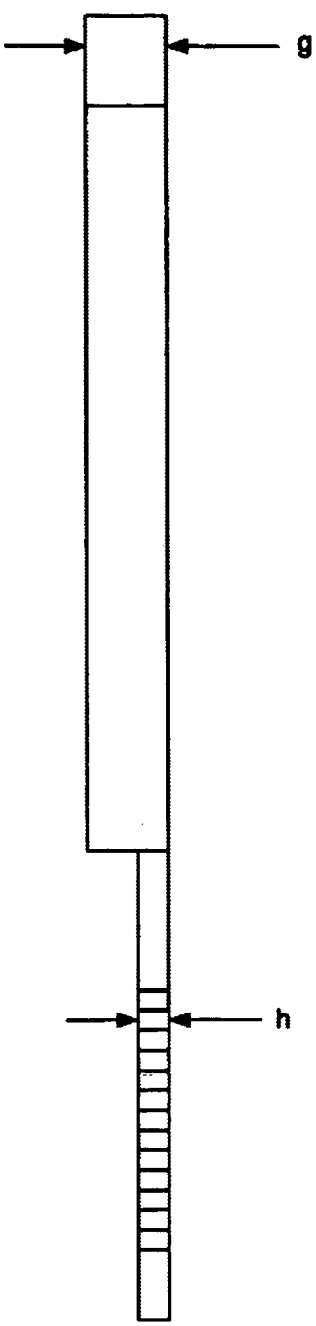

FIGS. 13A and 13B are diagrams showing a further specific example of contactor of the present invention wherein FIG. 13A is a front view and FIG. 13B is a side view thereof. The contactor of FIG. 13 has a base portion with an upper end to be protruded from the upper surface of the contact substrate 20 of FIGS. 5–7 when mounted thereon, a contact portion at a lower end to contact the surface of the contact target, and a straight body portion between the base portion and the contact portion to be inserted in the contact substrate 20 of FIGS. 5–7. The contact portion has a unique shape with two loop like springs to exert a contact force when pressed against the contact target.

In the front view of FIG. 13A, the base portion is extended in the right and left direction. In the side view of FIG. 13B, the contact portion is sized thinner than the body portion or the base portion to be easily deformed, thereby exerting the resilient spring force when pressed against the contact target. Because involving the two different thickness, the conductive materials may be deposited two or more times to establish the different thickness in the production process of the contactor. An example of sizes in the contactor of FIG. 13 is: a=1050.00 $\mu$m, b=500.00 $\mu$m, c=200.00 $\mu$m, d=50.00 $\mu$m, e=150.00 $\mu$m, f=20.00 $\mu$m, g=50.00 $\mu$m, and h=20.00 $\mu$m.

Figure 14E:
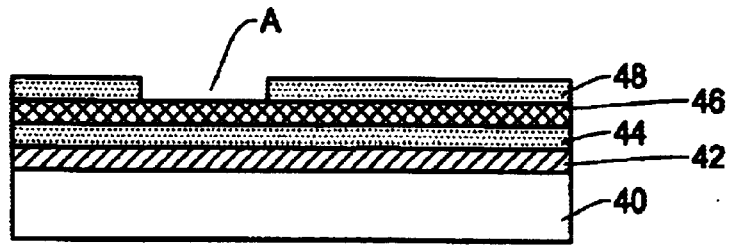

FIGS. 14A–14L are schematic diagrams showing an example of production process for producing the contactor 30 (such as contactor $30_3$ of FIG. 7) of the present invention. In FIG. 14A, a sacrificial layer 42 is formed on a substrate 40 which is typically a silicon substrate. Other dielectric substrate is also feasible such as a glass substrate and a ceramic substrate. The sacrificial layer 42 is made, for example, of silicon dioxide ($SiO_2$) through a deposition process such as a chemical vapor deposition (CVD) The sacrificial layer 42 is to separate contactors 30 from the silicon substrate in the later stage of the production process.

An adhesion promoter layer 44 is formed on the sacrificial layer 42 as shown in FIG. 14B through, for example, an evaporation process. An example of material for the adhesion promoter layer 44 includes chromium (Cr) and titanium (Ti) with a thickness of about 200–1,000 angstrom, for example. The adhesion promoter layer 44 is to facilitate the adhesion of conductive layer 46 of FIG. 14C on the silicon substrate 40. The conductive layer 46 is made, for example, of copper (Cu) or nickel (Ni), with a thickness of about 1,000–5,000 angstrom, for example. The conductive layer 46 is to establish electrical conductivity for an electroplating process in the later stage.

Figure 14F:
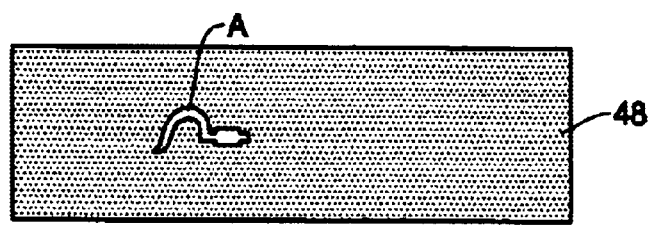

In the next process, a photoresist layer 48 is formed on the conductive layer 46 over which a photo mask 50 is precisely aligned to be exposed with ultraviolet (UV) light as shown in FIG. 14D. The photo mask 50 shows a two dimensional image of the contactor 30 which will be developed on the photoresist layer 48. As is well known in the art, positive as well as negative photoresist can be used for this purpose. If a positive acting resist is used, the photoresist covered by the opaque portions of the mask 50 hardens (cure) after the exposure. Examples of photoresist material include Novolak (M-Cresol-formaldehyde), PMMA (Poly Methyl Methacrylate), SU-8 and photo sensitive polyimide. In the development process, the exposed part of the resist can be dissolved and washed away, leaving a photoresist layer 48 of FIG. 14E having an opening or pattern "A". Thus, the top view of FIG. 14F shows the pattern or opening "A" on the photoresist layer 48 having the image (shape) of the contactor $30_3$.

In the photolithography process in the foregoing, instead of the UV light, it is also possible to expose the photoresist layer 48 with an electron beam or X-rays as is known in the art. Further, it is also possible to directly write the image of the contact structure on the photoresist layer 48 by exposing the photoresist 48 with a direct write electron beam, X-ray or light source (laser).

Figure 14G:
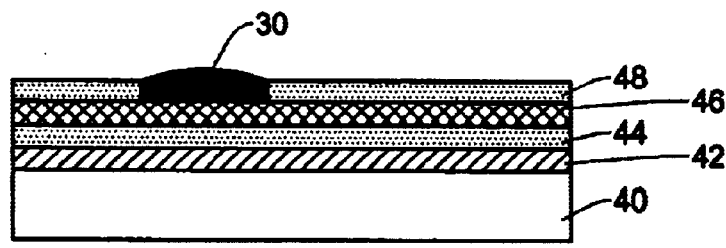
Figure 14H:
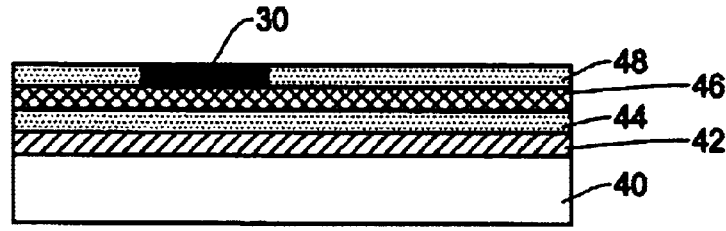

The contactor material such as copper (Cu), nickel (Ni) aluminum (Al), rhodium (Rh), palladium (Pd), tungsten (W) or other metal, nickel-cobalt (NiCo) or other alloy combinations thereof is deposited (electroplated) in the pattern "AA" of the photoresist layer 48 to form the contactor 30 as shown in FIG. 14G. Preferably, a contact material which is different from that of the conductive layer 46 should be used to differentiate etching characteristics from one another as will be described later. The over plated portion of the contactor 30 in FIG. 14G is removed in the grinding (planarizing) process of FIG. 14H.

The above noted process is repeated for producing the contactors such as shown in FIGS. 10–13 having different thickness by forming two or more conductive layers. Namely, after forming a first layer of the contactors (conductive material), if necessary, the processes of FIGS. 14D–14H are repeated to form a second layer or further layer on the first layer of the contactors.

Figure 14I:
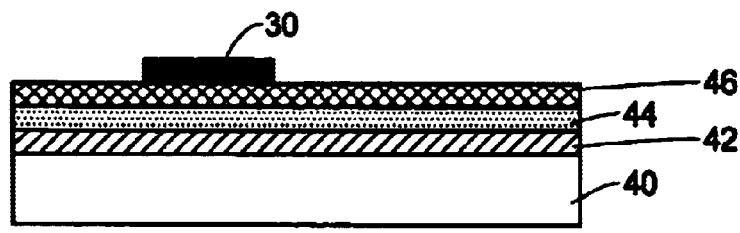
Figure 14J:
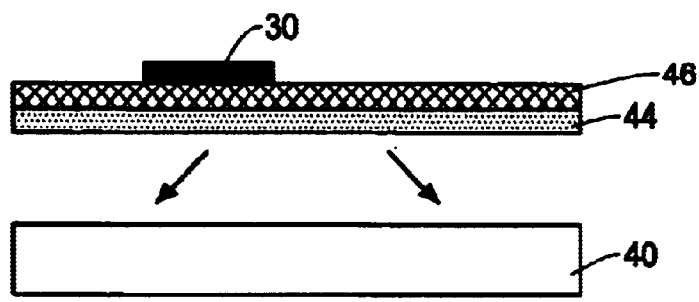
Figure 14K:
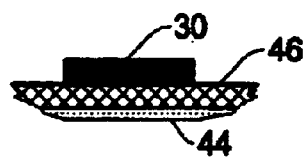
Figure 14L:
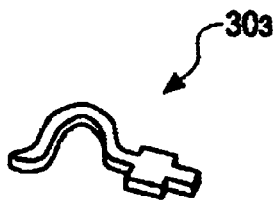

In the next process, the photoresist layer 48 is removed in a resist stripping process as shown in FIG. 14I. Typically, the resist layer 48 is removed by wet chemical processing. Other examples of stripping are acetone-based stripping and plasma $O_2$ stripping. In FIG. 14J, the sacrificial layer 42 is etched away so that the contactor 30 is separated from the silicon substrate 40. Another etching process is conducted so that the adhesion promoter layer 44 and the conductive layer 46 are removed from the contactor 30 as shown in FIG. 14K.

The etching condition can be selected to etch the layers 44 and 46 but not to etch the contactor 30. In other words, to etch the conductive layer 46 without etching the contactor 30, as noted above, the conductive material used for the contactor 30 must be different from the material of the conductive layer 46. Finally, the contactor 30 is separated from any other materials as shown in the perspective view of FIG. 14L. Although the production process in FIGS. 14A–14L shows only one contactor 30, in an actual production process, as shown in FIGS. 8A and 8B, a large number of contactors are produced at the same time.

FIGS. 15A–15D are schematic diagrams showing an example of production process for producing the contactors of the present invention. In the this example, an adhesive tape (intermediate plate) 90 is incorporated in the production process to transfer the contactors 30 from the silicon substrate 40 to the adhesive tape. FIGS. 15A–15D only show the latter part of the production process in which the adhesive tape 90 is involved.

Figure 15A:
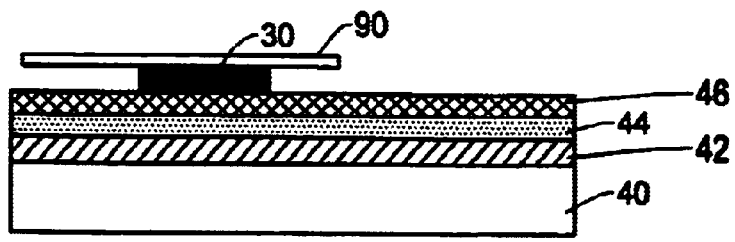
FIGS. 15A–15D are schematic diagrams showing another example of production process in the present invention for producing the contactors.

FIG. 15A shows a process which is equivalent to the process shown in FIG. 14I where the photoresist layer 48 is removed in the resist stripping process. Then, also in the process of FIG. 15A, an adhesive tape (intermediate plate) 90 is placed on an upper surface of the contactor 30 so that the contactor 30 adheres to the adhesive tape 90. As noted above with reference to FIG. 8B, within the context of the present invention, the adhesive tape (intermediate plate) 90 includes other types of adhesive member, such as an adhesive film and adhesive plate, and the like. The adhesive tape 90 also includes any member which attracts the contactor 30 such as a magnetic plate or tape, an electrically charged plate or tape, and the like.

Figure 15B:
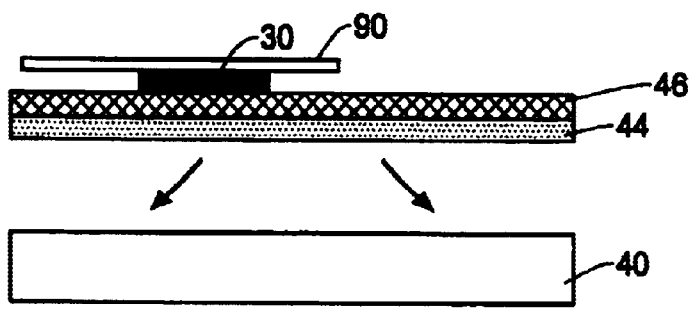
Figure 15C:
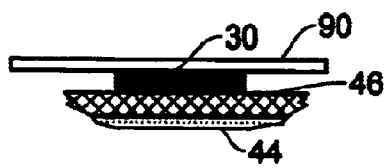
Figure 15D:
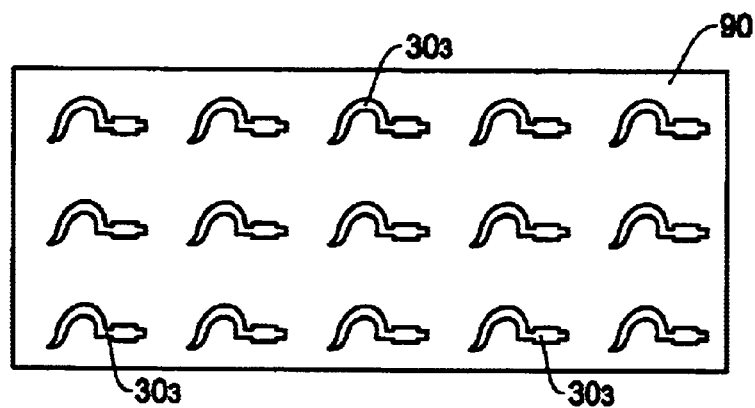

In the process shown in FIG. 15B, the sacrificial layer 42 is etched away so that the contactor 30 on the adhesive tape 90 is separated from the silicon substrate 40. Another etching process is conducted so that the adhesion promoter layer 44 and the conductive layer 46 are removed from the contactor 30 as shown in FIG. 15C.

As noted above, in order to etch the conductive layer 46 without etching the contactor 30, the conductive material used for the contactor 30 must be different from the material of the conductive layer. Although the production process in FIGS. 15A–15C shows only one contactor, in an actual production process, a large number of contactors are produced at the same time. Thus, a large number of contactors 30 are transferred to the adhesive tape 90 and separated from the silicon substrate and other materials as shown in the top view of FIG. 15D.

Figure 16A:
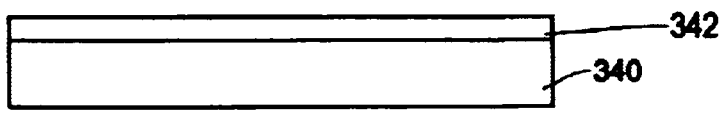
FIGS. 16A–16N are schematic diagrams showing an example of process for producing contact structures in the horizontal surface of a substrate and transferring the contactors to an intermediate plate.
Figure 16B:
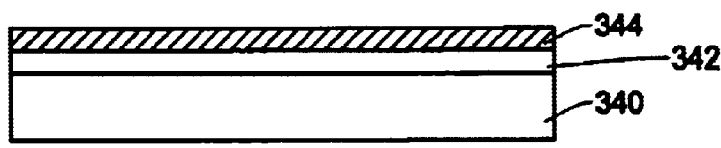
Figure 16C:
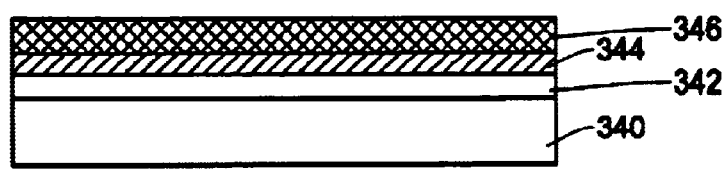
Figure 16D:
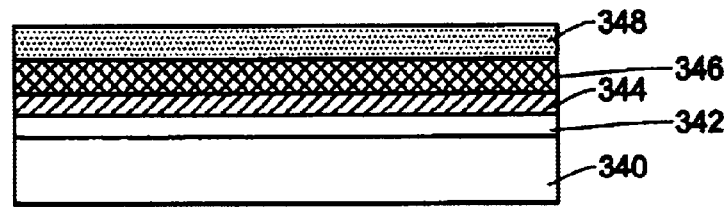
Figure 16E:
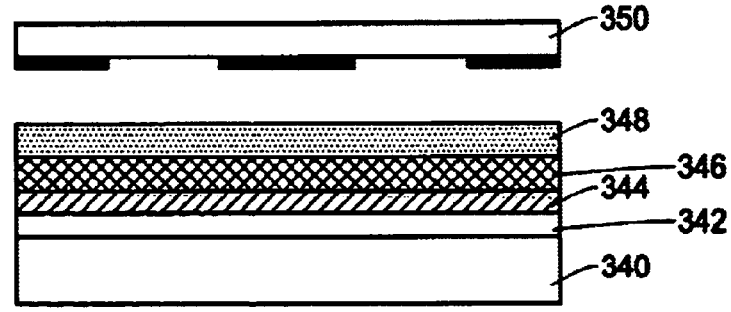
Figure 16F:
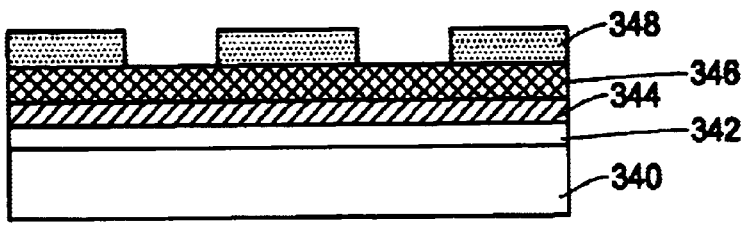
Figure 16G:
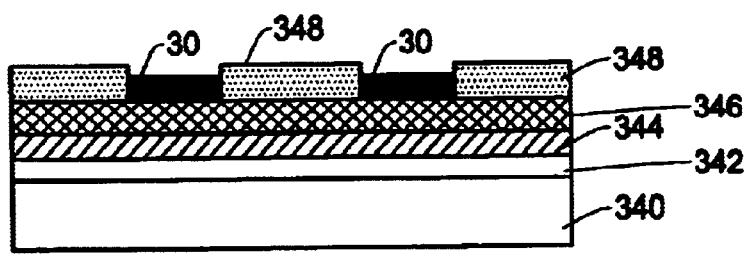
Figure 16H:
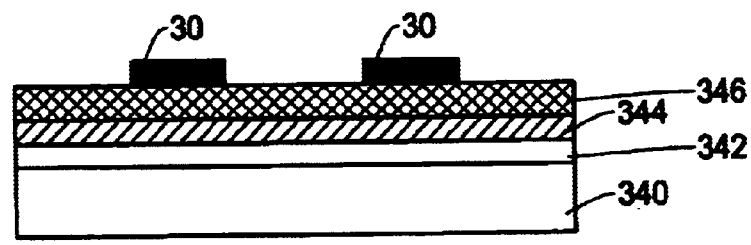
Figure 16I:
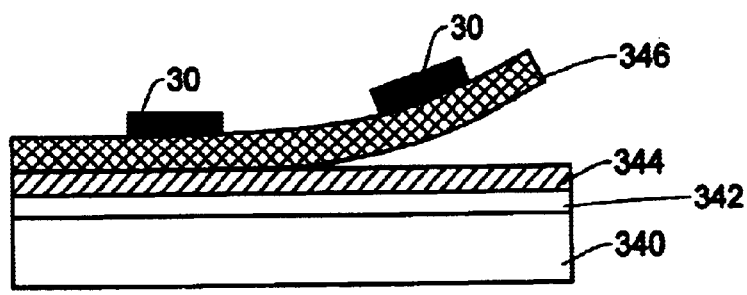
Figure 16J:
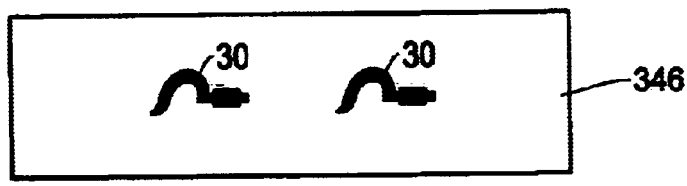
Figure 16K:
Figure 16L:
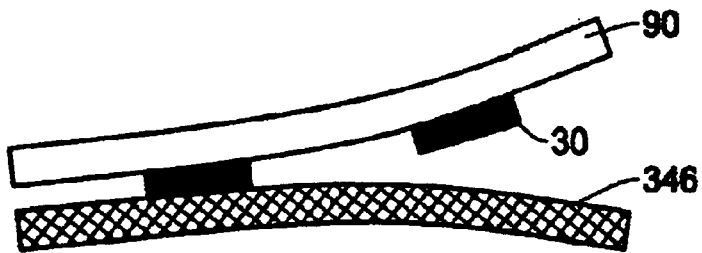
Figure 16M:
Figure 16N:

FIGS. 16A–16N are schematic diagrams showing a further example of production process for producing the contactor 30 where the contactors are transferred to the adhesive tape or intermediate plate. In FIG. 16A, an electroplating seed (conductive) layer 342 is formed on a substrate 340 which is typically a silicon or glass substrate. The seed layer 342 is made, for example, of copper (Cu) or nickel (Ni), with a thickness of about 1,000–5,000 angstrom, for example. A chrome-inconel layer 344 is formed on the seed layer 342 as shown in FIG. 16B through, for example, a sputtering process.

In the next process in FIG. 16C, a conductive substrate 346 is formed on the chrome-inconel layer 344. The conductive substrate 346 is made, for example, of nickel-cobalt (NiCo) with a thickness of about 100–130 μm. After passivating the conductive substrate 346, a photoresist layer 348 with a thickness of about 100–120 μm is formed on the conductive substrate 346 in FIG. 16D and a photo mask 350 is precisely aligned so that the photoresist layer 348 is exposed with ultraviolet (UV) light as shown in FIG. 16E. The photo mask 350 shows a two dimensional image of the contactor 30 which will be developed on the surface of the photoresist layer 348.

In the development process, the exposed part of the resist can be dissolved and washed away, leaving a photoresist layer 348 of FIG. 16F having a plating pattern transferred from the photo mask 350 having the image (shape) of the contactor 30 (such as contactor $30_3$ of FIG. 7). In the step of FIG. 16G, contactor material is electroplated in the plating pattern on the photoresist layer 348 with a thickness of about 50–60 μm. An example of the conductive material is nickel-cobalt (NiCo). The nickel-cobalt contactor material will not strongly adhere to the conductive substrate 346 made of nickel-cobalt.

The above noted process may be repeated for producing the contactors such as shown in FIGS. 10–13 having different thickness by forming two or more conductive layers. Namely, after forming a first layer of the contactors, if necessary, the processes of FIGS. 16D–16G are repeated to form a second layer or further layer on the first layer of the contactors.

In the next process, the photoresist layer 348 is removed in a resist stripping process as shown in FIG. 16H. In FIG. 16I, the conductive substrate 346 is peeled from the chrome-inconel layer 344 on the substrate 340. The conductive substrate 346 is a thin substrate on which the contactors 30 are mounted with a relatively weak adhesive strength. The top view of the conductive substrate 346 having the contactors 30 is shown in FIG. 16J.

FIG. 16K shows a process in which an adhesive tape (intermediate plate) 90 is placed on the upper surfaces of the contactors 30. The adhesive strength between the adhesive tape 90 and the contactors 30 is greater than that between the contactors 30 and the conductive substrate 346. Thus, when removing the adhesive tape 90 from the flexible conductive substrate 346, the contactors 30 are transferred from the substrate 346 to the adhesive tape 90 as shown in FIG. 16L. FIG. 16M shows a top view of the adhesive tape 90 having the contactors 30 thereon and FIG. 16N is a cross sectional view of the adhesive tape 90 having the contactors 30 thereon.

Figure 17A:
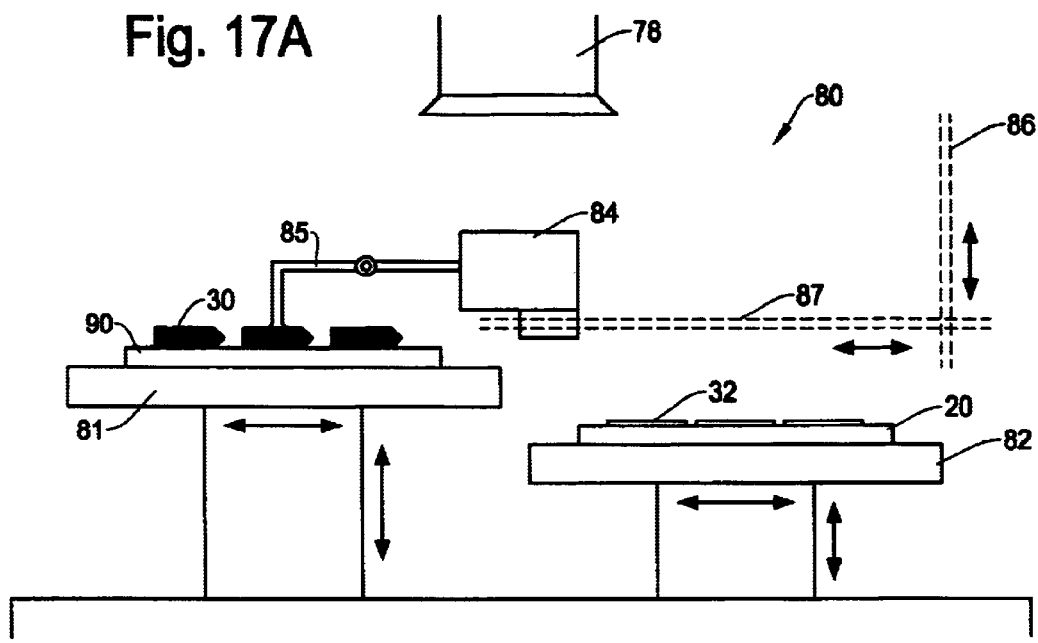
FIGS. 17A and 17B are schematic diagrams showing an example of pick and place mechanism and its process for picking the contactors and placing the same on a substrate such as a multi-layered silicon substrate to produce the contact structure of the present invention.
Figure 17B:
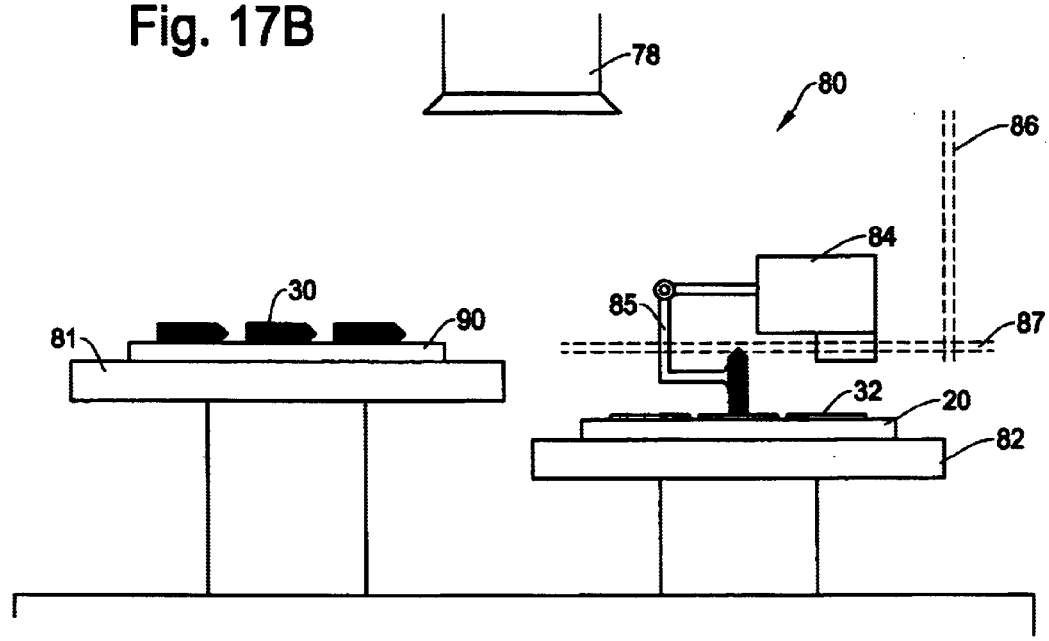

FIGS. 17A and 17B are schematic diagrams showing an example of process for picking the contactors 30 from the adhesive tape (intermediate plate) 90 and placing the contactors on the contact substrate 20. The pick and place mechanism of FIGS. 17A and 17B is advantageously applied to the contactors produced by the production process of the present invention described with reference to FIGS. 15A–15D and FIGS. 16A–16N involving the adhesive tape. FIG. 17A is a front view of the pick and place mechanism 80 showing the first half process of the pick and place operation. FIG. 17B is a front view of the pick and place mechanism 80 showing the second half process of the pick and place operation.

In this example, the pick and place mechanism 80 is comprised of a transfer mechanism 84 to pick and place the contactors 30, mobile arms 86 and 87 to allow movements of the transfer mechanism 84 in X, Y and Z directions, tables 81 and 82 whose positions are adjustable in X, Y and Z directions, and a monitor camera 78 having, for example, a CCD image sensor therein. The transfer mechanism 84 includes a suction arm 85 that performs suction (pick operation) and suction release (place operation) operations for the contactors 30. The suction force is created, for example, by a negative pressure such as vacuum. The suction arm 85 rotates in a predetermined angle such as 90 degrees.

In operation, the adhesive tape 90 having the contactors 30 and the contact substrate 20 having the bonding locations 32 (or through holes) are positioned on the respective tables 81 and 82 on the pick and place mechanism 80. As shown in FIG. 17A, the transfer mechanism 80 picks the contactor 30 from the adhesive tape 90 by suction force of the suction arm 85. After picking the contactor 30, the suction arm 85 rotates by 90 degrees, for example, as shown in FIG. 17B. Thus, the orientation of the contactor 30 is changed from the horizontal direction to the vertical direction. This orientation mechanism is just an example, and a person skilled in the art knows that there are many other ways to change the orientation of the contactors. The transfer mechanism 80 then places the contactor 30 on the bonding location 32 (or through holes) on the substrate 20. The contactor 30 is attached to the contact substrate 20 by being bonded to the surface or inserted in the through holes.

Figure 1:
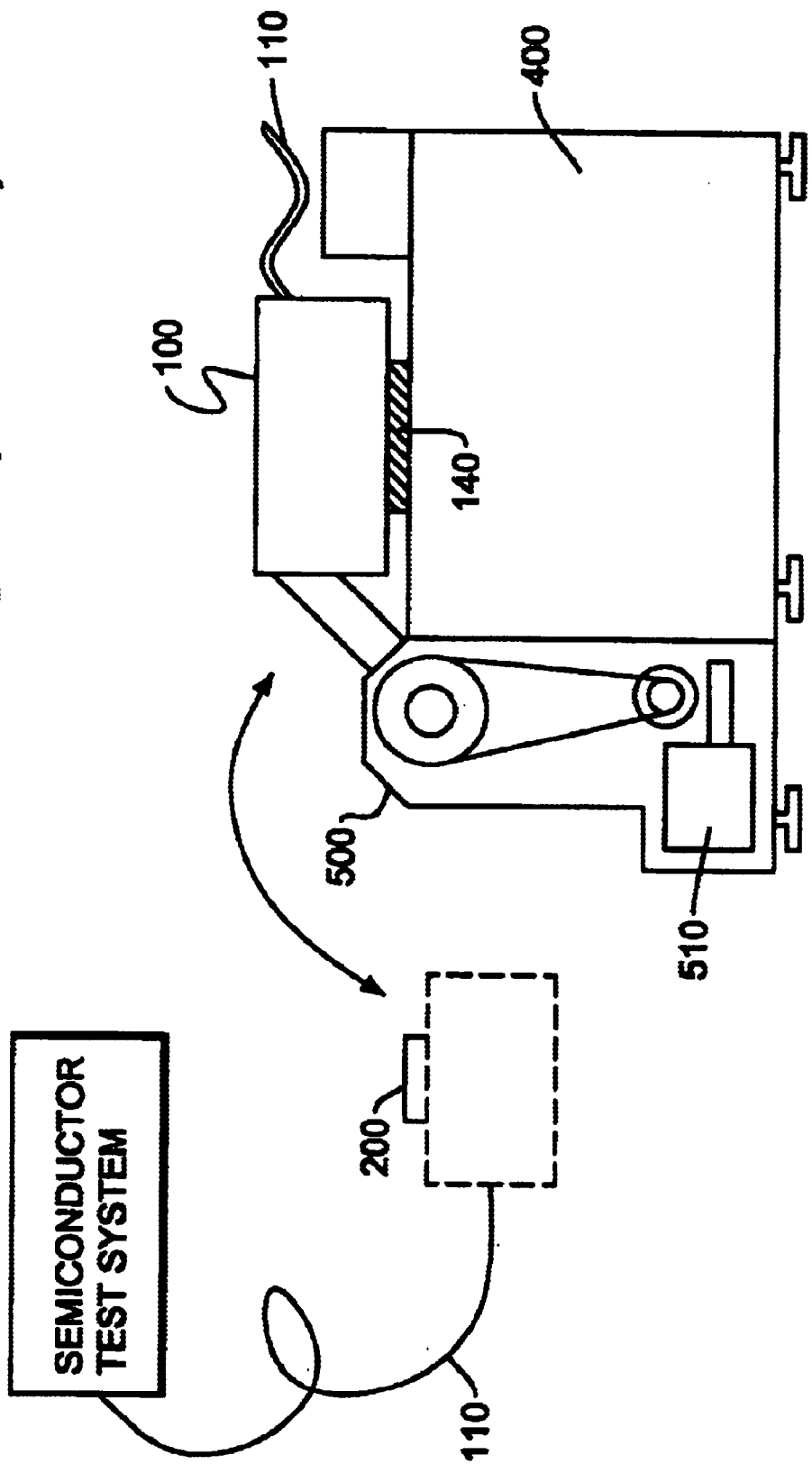
FIG. 1 is a schematic diagram showing a structural relationship between a substrate handler and a semiconductor test system having a test head.
Figure 2:
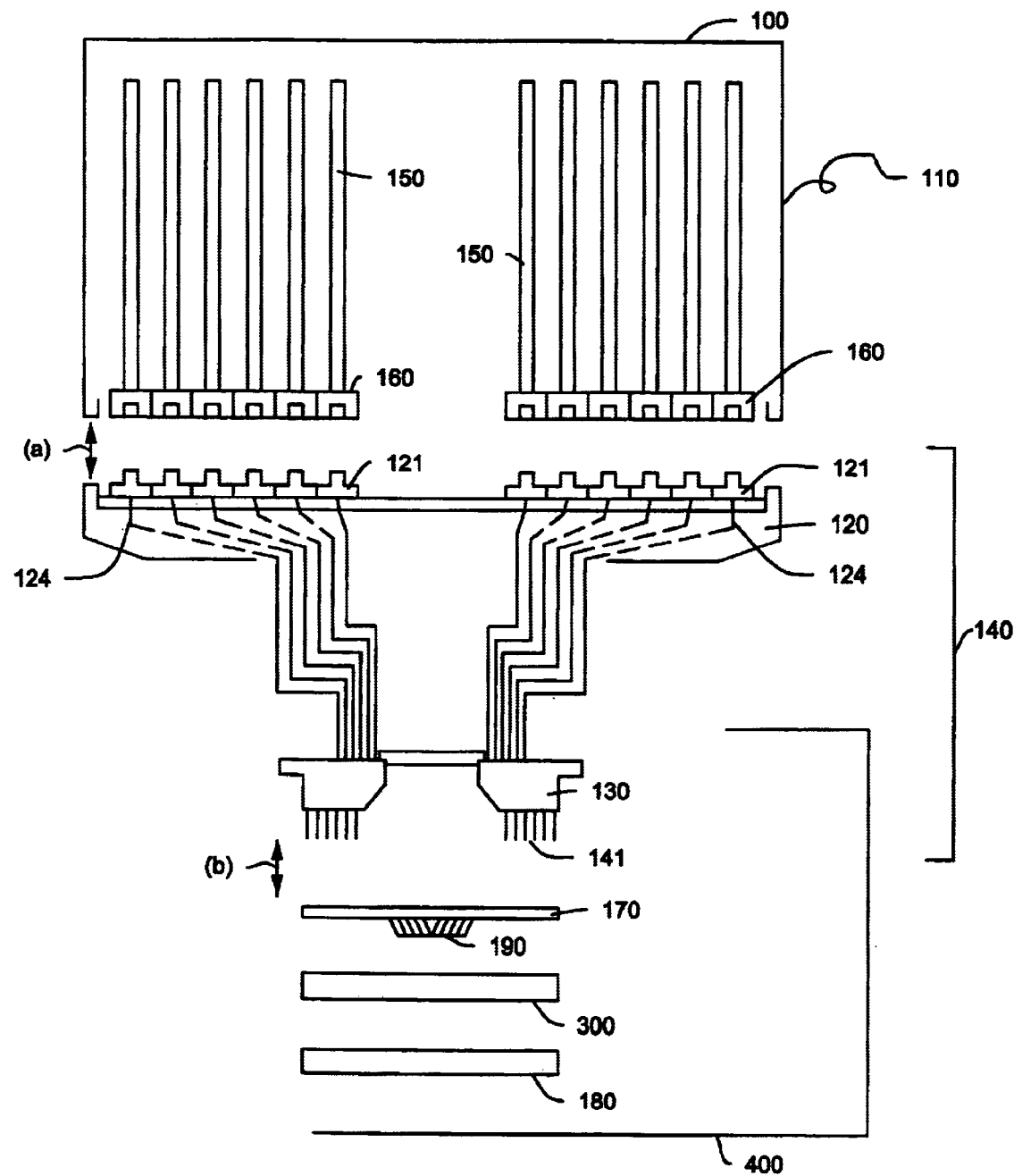
FIG. 2 is a diagram showing an example of more detailed structure for connecting the test head of the semiconductor test system to the substrate handler through an interface component.
Figure 3:
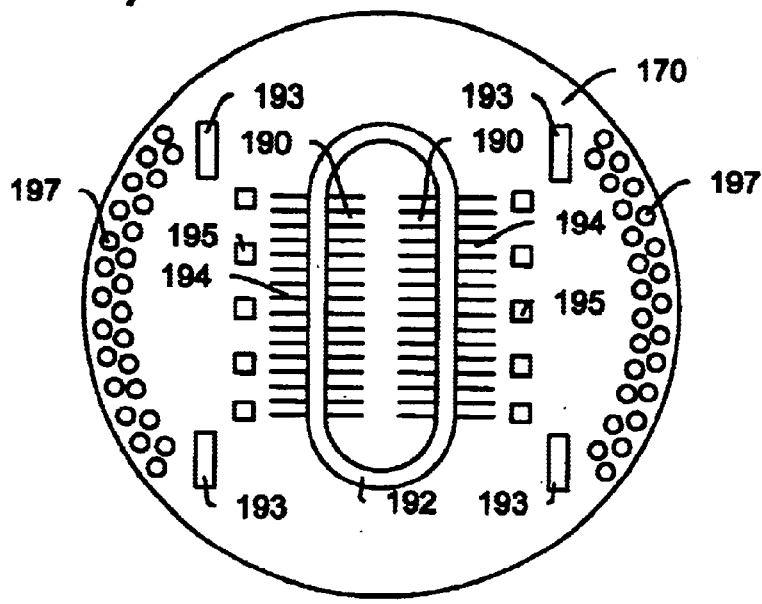
FIG. 3 is a bottom view showing an example of the probe card having an epoxy ring for mounting a plurality of probe contactors (needles or cantilevers) in the conventional technology.
Figure 4A:
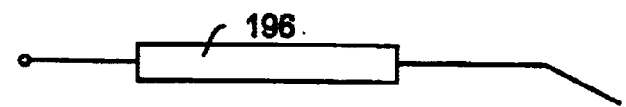
FIGS. 4A–4E are circuit diagrams showing equivalent circuits of the probe card of FIG. 3.
Figure 4B:
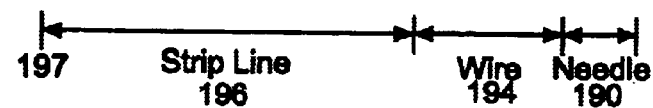
Figure 4C:
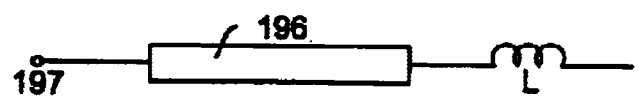
Figure 4D:
Figure 4E:

FIG. 18 is a cross sectional view showing an example of total stack-up structure for forming a probe contact assembly using the contact structure of the present invention. The probe contact assembly is used as an interface between the device under test (DUT) and the test head such as shown in FIG. 2. In this example, the probe contact assembly includes a routing board (probe card) 260, and a pogo-pin block (frog ring) 130 provided over the contact structure in the order shown in FIG. 18. The contact structure is configured by a plurality of contactors $30_1$ mounted on the contact substrate 20. A base portion 35 of each of the contactors is projected at an upper surface of the contact substrate 20 as a contact pad.

The probe card 260, pogo-pin block 130 and contact structure are mechanically as well as electronically connected with one another, thereby forming a probe contact assembly. Thus, electrical paths are created from the contact point of the contactors $30_1$ to the test head 100 through the cables 124 and performance board 120 (FIG. 2). Thus, when the semiconductor wafer 300 and the probe contact assembly are pressed with each other, electrical communication will be established between the DUT (contact pads 320 on the wafer 300) and the test system.

The pogo-pin block (frog ring) 130 is equivalent to the one shown in FIG. 2 having a large number of pogo-pins to interface between the probe card 260 and the performance board 120. At upper ends of the pogo-pins, cables 124 such as coaxial cables are connected to transmit signals to printed circuit boards (pin electronics cards) 150 in the test head 100 in FIG. 2 through the performance board 120. The probe card 260 has a large number of electrodes 262 and 265 on the upper and lower surfaces thereof. When assembled, the base portions 35 of the contactors 30 contact the electrodes 262. The electrodes 262 and 265 are connected through interconnect traces 263 to fan-out the pitch of the contact structure to meet the pitch of the pogo-pins in the pogo-pin block 130.

FIG. 19 is a cross sectional view showing another example of probe contact assembly using the contact structure of the present invention. The probe contact assembly is used as an interface between the device under test (DUT) and the test head such as shown in FIG. 2. In this example, the probe contact assembly includes a conductive elastomer 250, a probe card 260, and a pogo-pin block (frog ring) 130 provided over the contact structure.

The conductive elastomer 250 is provided between the contact structure and the probe card 260. When assembled, the base portions 35 of the contactors 30 contact the conductive elastomer 250. The conductive elastomer 250 is to ensure electrical communications between the base portions 35 of the contactors $30_1$ and the electrodes 262 of the probe card 260 by compensating irregularity of flatness or vertical gaps therebetween. The conductive elastomer 250 is an elastic sheet having a large number of conductive wires in a vertical direction. For example, the conductive elastomer 250 is comprised of a silicon rubber sheet and a multiple rows of metal filaments. The metal filaments (wires) are provided in the vertical direction of FIG. 19, i.e., orthogonal to the horizontal sheet of the conductive elastomer 250. An example of pitch between the metal filaments is 0.05 mm or less and thickness of the silicon rubber sheet is about 0.2 mm. Such a conductive elastomer is produced by Shin-Etsu Polymer Co. Ltd, Japan, and available in the market.

FIG. 20 is a cross sectional view showing a further example of probe contact assembly using the contact structure of the present invention. The probe contact assembly is basically the same as that of FIG. 19 except for the contact structure which is formed of a plurality of contact structure (substrate) blocks. Further, the contact substrate block is formed of a plurality of standard substrates stacked together. For example, the contact structure of FIG. 20 is configured by two contact structure (substrate) blocks $20_1$ and $20_2$ each having three silicon standard substrates $22_1$, $22_2$ and $22_3$.

Figure 23:
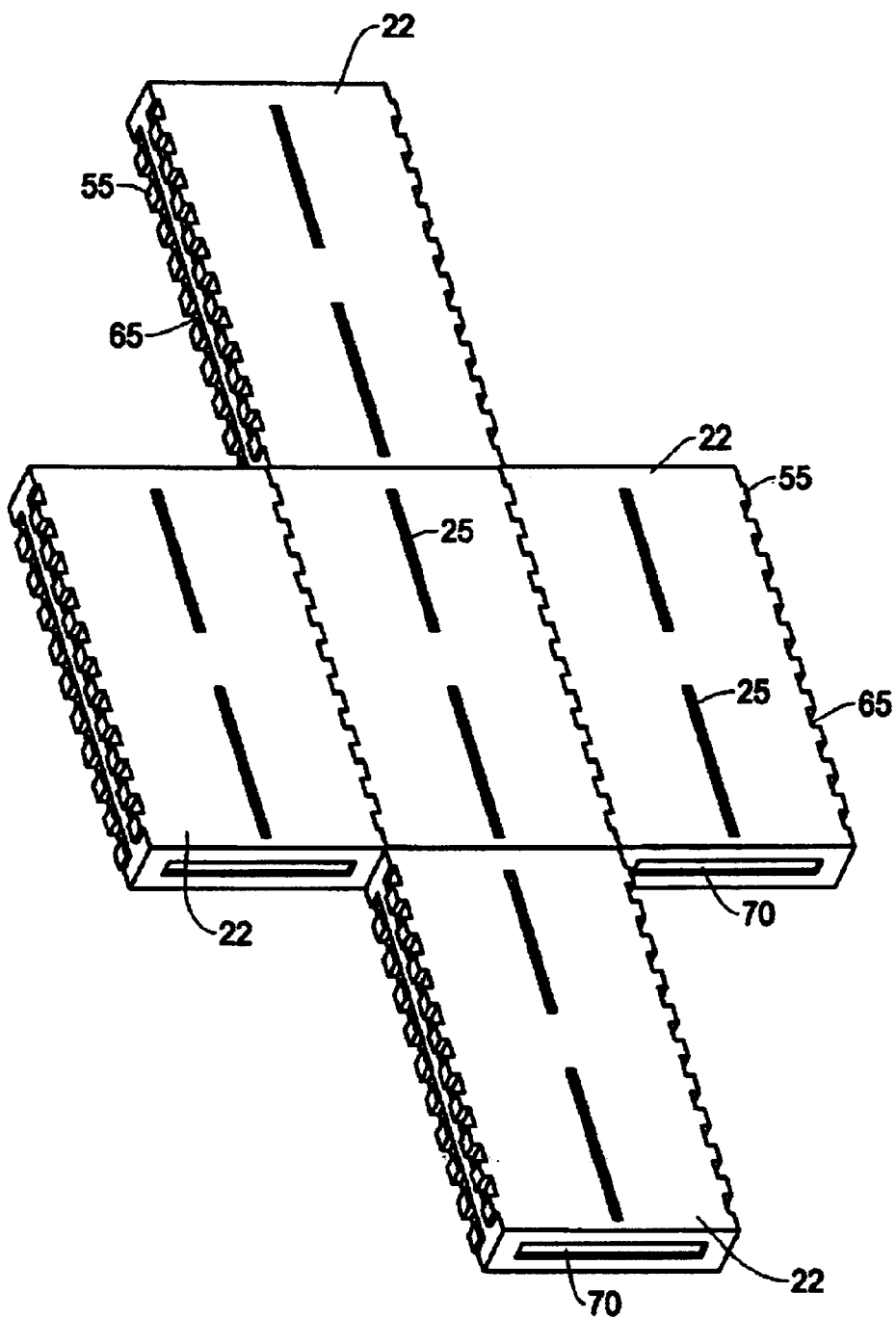
FIG. 23 is a perspective view of the contact structure of the present invention wherein plural contact substrates are connected with one another to establish a probe contact assembly with desired size, shape and number of contactors.

Although only one of them is shown, a plurality of contactors $30_1$ are attached to the contact substrate 20 in a manner that an end of each contactor $30_1$ is inserted in a through hole 25 (FIG. 21) of the substrate 22. Typically, the contact substrate 22 is made of silicon wafer, however, other dielectric materials such as ceramic, glass, polyimide and the like are also feasible. In the preferred embodiment, the contact substrate 22 is a multi-layered substrate having multiple standard silicon wafers such as three wafers $22_1$, $22_2$ and $22_3$ which are stacked and bonded to one another. The major reason of using the multiple silicon wafers is to attain a sufficient thickness of the contact substrate without increasing tolerance in mechanical dimensions. Thus, the number of silicon wafers can be selected freely such as one or more depending on the specific requirements in the design. The standard silicon wafers have the same thickness but different outer shape to create engagement mechanism such as teeth and recesses as shown in FIG. 23.

Figure 21:
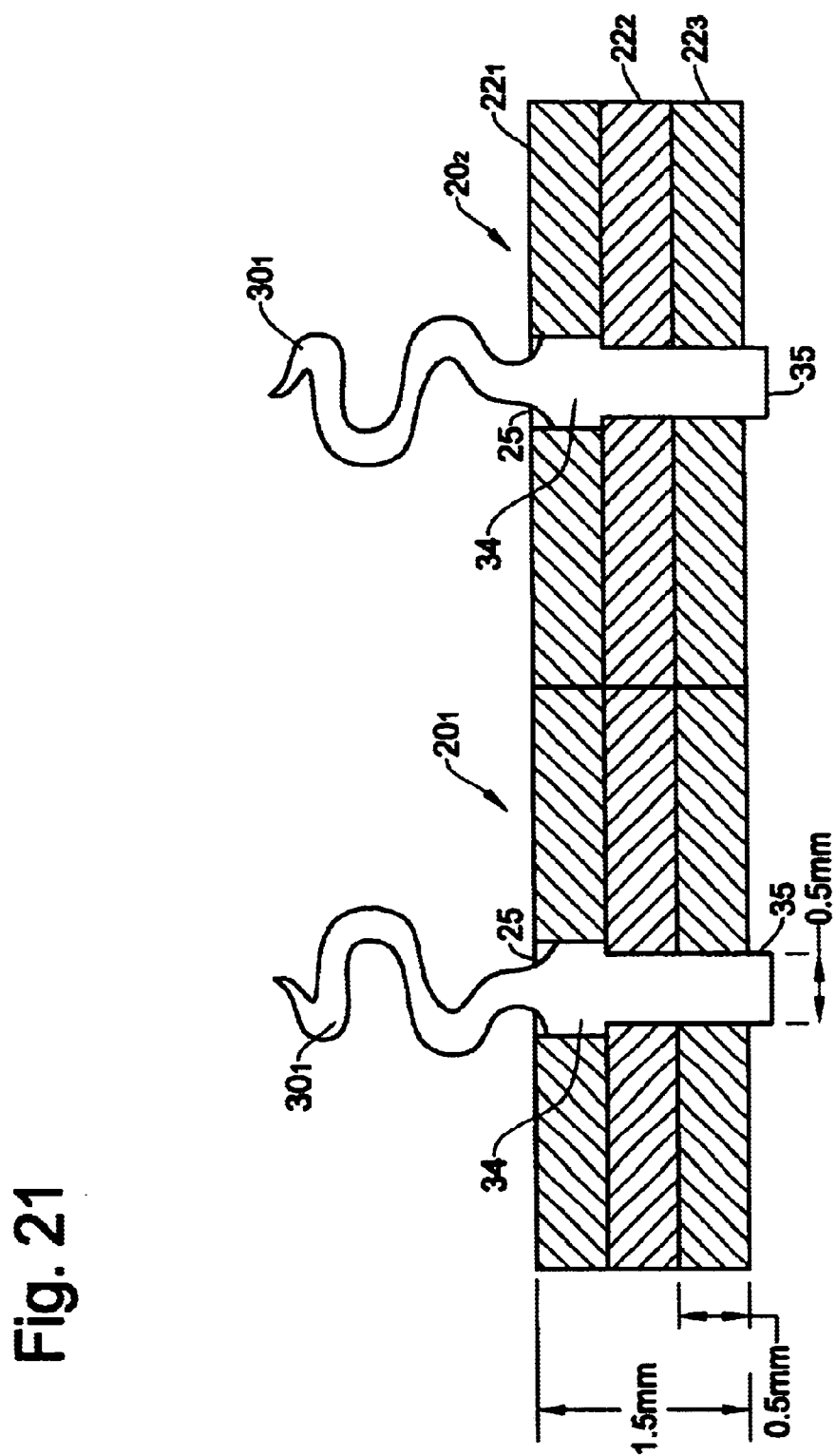
FIG. 21 is a schematic diagram showing an example of contact structure of the present invention having multilayered standard silicon substrates and the contactors produced through the production process of the present invention.

FIG. 21 is a cross sectional view showing details of contact structure of the present invention incorporated in the probe contact assembly of FIG. 20. The contactor $30_1$ having the meander or hook shape is attached to the contact substrate 20 in a manner that an end of the contactor $30_1$ is inserted in a through hole 25. In this example, the contact substrate 20 is a multi-layered substrate having three standard silicon wafers $22_1$, $22_2$ and $22_3$ which are stacked and fusion bonded to one another. An example of thickness of each of the silicon wafers $22_1$–$22_3$ is about 0.5 mm. The end of the contactor $30_1$ is projected from the bottom surface of the contact substrate 20 for forming the contact pad 35. As an example, the size of the contact pad 35 is 0.5 mm in its width. The contactor $30_1$ has a flange like portion 34 to be fitted with a step provided in the through hole 25. A contact point at the tip of the contactor $30_1$ is preferably sharpened to promote the scrubbing effect on the surface of the contact target.

The process of forming three layered substrate 20 and through holes thereon shown in FIG. 21 is briefly explained in the following. First, the second wafer $22_2$ and the third wafer $22_3$ are directly bonded through, for example, silicon fusion bonding. Then the wafers $22_2$ and $22_3$ are polished both front and back, and through holes are created therethrough by an etching process. Such a deep trench etching is achieved, for example, by reactive ion etching using a reactive gas plasma. As shown in FIG. 21, the size of the through holes on the second and third wafers $22_2$ and $22_3$ must be smaller than the flange like portion 34 of the contactor 30 to form the steps in the through holes.

Then, the first wafer $22_1$ is polished its front and back surfaces and through holes 25 are created therethrough by the deep trench etching noted above. The size of the through holes of the first wafer $22_1$ is larger than that of the second and third wafers $22_2$ and $22_3$ to receive the flange like portion 34 of the contactor 30 as noted above. The first wafer $22_1$ is aligned and fusion bonded to the second and third wafers $22_2$ and $22_3$. For insulation, silicon oxide layers of, for example, at least one micrometer is preferably grown on all of the exposed surfaces of the contact substrate produced in this manner. Then, the contactor 30 is inserted in the through holes 25 and fixed therein by an adhesive if necessary.

Figure 22:
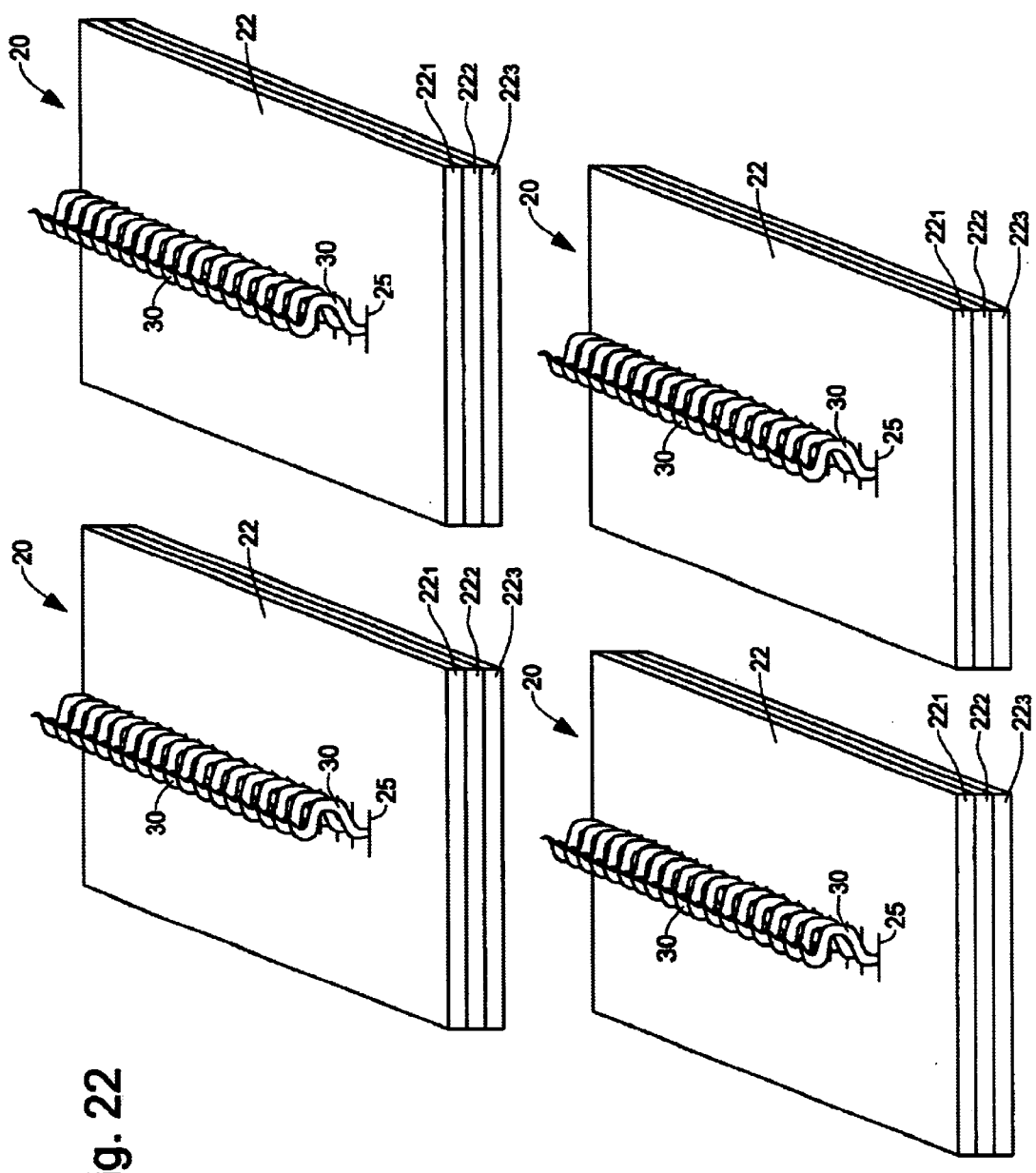
FIG. 22 is a perspective view showing a plurality of contact structures of the present invention each having a large number of contactors for assembling with one another to constitute a probe contact assembly of desired size.

FIG. 22 is a perspective view showing an example of contact structure (substrate) blocks of the present invention each having a large number of contactors 30 produced through the process shown in FIGS. 8A and 8B. This example shows a plurality of contact structure blocks 20 to be assembled with one another to build a contact structure of desired size and desired number of contactors. In FIG. 22, although each contact structure block includes contactors assembled in a single line, a contact structure block of the present invention may include contactors aligned in two or more lines, i.e, a matrix manner.

As noted above, one of the features of the present invention is the capability of combining a plurality of contact structure blocks 20 to create a contact structure (probe contact assembly) of increased overall size and number of contactors. In the example of FIG. 22 four contact structures 20 are prepared to be connected to one another. Although not shown in the example of FIG. 22 each contact substrate 22 has connection or engagement mechanism such as teeth at the outer edges thereof.

FIG. 23 is a perspective view of the contact structure formed by a plurality of contact structure blocks of the present invention. In this example, five contact substrates are connected with one another to create a contact structure having an overall size which is an integer multiple of the size of the contact structure block. For simplicity of illustration, the contactors are not shown on the contact substrates 22. By combining the contact substrates 22 in this manner, a contact assembly of desired size such as equivalent to the size of a twelve-inch semiconductor wafer can be established.

In this example, the right and left edges of the contact substrate are provided with engagement teeth 55 and recesses 65. The size of the tooth 55 and recess 65 is the same in the right and left edges, however, the position of the tooth 55 and recess 65 is shifted by one unit. Thus, the left edge of one contact substrate 22 fits with the right edge of the another contact substrate 22. Although not shown in FIG. 23, a projection is provided at a distal end of the contact substrate 22 to fit in a groove 70 at a proximal end of another contact substrate 22. Instead of using the projections and grooves, it is also possible to use the teeth and recesses such as in the right and left edges described above. The contactors 30 will be mounted on the contact substrates 22 in the manner shown in FIGS. 22 in through holes 25.

According to the present invention, the contact structure has a very high frequency bandwidth to meet the test requirements of next generation semiconductor technology. Since the large number of contactors are produced at the same time on the substrate without involving manual handling, it is possible to achieve consistent quality, high reliability and long life in the contact performance. Further, because the contactors are assembled on the same substrate material as that of the device under test, it is possible to compensate positional errors caused by temperature changes. Further, it is possible to produce a large number of contactors in a horizontal direction on the silicon substrate by using relatively simple technique. The contact structure produced by the present invention is low cost and high efficiency and has high mechanical strength and reliability. The contact structure produced by the method of the present invention are advantageously applied in testing a semiconductor wafer, packaged LSI, multi-chip module and the like including burn-in testing.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for producing a contact structure, comprising the following steps of:
   (a) forming a sacrificial layer on a surface of a substrate;
   (b) forming a photoresist layer on the sacrificial layer on the substrate;
   (c) aligning a photo mask over the photoresist layer and exposing the photoresist layer with ultraviolet light through the photo mask, the photo mask including an image of contactors;
   (d) developing patterns of the image of the contactors on a surface of the photoresist layer;
   (e) forming the contactors made of electric conductive material in the patterns on the photoresist layer, each of the contactors having a tip portion at one end of the contactor to contact with the contact target, a base portion at another end of the contactor, a straight body portion provided between the tip portion and the base portion, a flange at the base portion, and a spring portion provided between the tip portion and the straight body portion which has significantly smaller thickness than that of the body portion or base portion;
   (f) stripping off the photoresist layer;
   (g) removing the sacrificial layer and the conductive layer so that the contactors are separated from the silicon substrate; and
   (h) mounting the contactors on a contact substrate having through holes to receive ends of the contactors therein so that at least one end of each of the contactors functions as a contact pad for electric connection.

2. A method for producing a contact structure as defined in claim 1, wherein said step of forming the contactors including a step of repeating the steps (b)–(e) to create a difference in the thickness between the spring portion and the straight body portion.

3. A method for producing a contact structure as defined in claim 1, wherein said step of exposing the photoresist layer is a step of exposing the photoresist layer by an electron beam or X-rays through the photo mask.

4. A method for producing a contact structure as defined in claim 1, wherein said step of exposing the photoresist layer is a step of exposing the photoresist layer by an electron beam, X-ray or laser light to directly form the patterns of the image of the contactor on the photoresist layer.

5. A method for producing a contact structure as defined in claim 1, further including a step of forming an conductive layer made of electric conductive material on the sacrificial layer, and a step of forming an adhesion promoter layer between the sacrificial layer and the conductive layer.

6. A method for producing a contact structure as defined in claim 5, wherein the electric conductive material for the conductive layer is different from the electric conductive material for the contactors.

7. A method for producing a contact structure, comprising the following steps of:
   (a) forming a sacrificial layer on a surface of a substrate;
   (b) forming a photoresist layer on the sacrificial layer on the substrate;
   (c) aligning a photo mask over the photoresist layer and exposing the photoresist layer with ultraviolet light through the photo mask, the photo mask including an image of the contactors;
   (d) developing patterns of the image of the contactors on a surface of the photoresist layer;
   (e) forming the contactors made of electric conductive material in the patterns on the photoresist layer, each of the contactors having a tip portion at one end of the contactor to contact with the contact target, a base portion at another end of the contactor, a straight body portion provided between the tip portion and the base portion, a flange at the base portion, and a spring portion provided between the tip portion and the straight body portion which has significantly smaller thickness than that of the body portion or base portion;
   (f) stripping the photoresist layer;

(g) placing an adhesive tape on the contactors so that upper surfaces of the contactors adhere to the adhesive tape;

(h) removing the sacrificial layer and conductive layer by an etching process so that the contactors on the adhesive tape are separated from the silicon substrate; and (i) mounting the contactors on a contact substrate having through holes to receive therein ends of the contactors wherein at least one end of each of the contactors function as a pad for electric connection.

8. A method for producing a contact structure as defined in claim 7, wherein said step of forming the contactors including a step of repeating the steps (b)–(e) to create a difference in the thickness between the spring portion and the straight body portion.

9. A method for producing a contact structure as defined in claim 7, wherein said step of exposing the photoresist layer is a step of exposing the photoresist layer by an electron beam or X-rays through the photo mask.

10. A method for producing a contact structure as defined in claim 7, wherein said step of exposing the photoresist layer is a step of exposing the photoresist layer by an electron beam, X-ray or laser light to directly form the patterns of the image of the contactor on the photoresist layer.

11. A method for producing a contact structure as defined in claim 7, further including a step of forming an conductive layer made of electric conductive material on the sacrificial layer, and a step of forming an adhesion promoter layer between the sacrificial layer and the conductive layer.

12. A method for producing a contact structure as defined in claim 11, wherein the electric conductive material for the conductive layer is different from the electric conductive material for the contactors.

13. A method for producing a contact structure, comprising the following steps of:

(a) forming an conductive substrate made of electric conductive material on a dielectric substrate;

(b) forming a photoresist layer on the conductive substrate;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming the contactors made of electric conductive material in the patterns on the photoresist layer, each of the contactors having a tip portion at one end of the contactor to contact with the contact target, a base portion at another end of the contactor, a straight body portion provided between the tip portion and the base portion, a flange at the base portion, and a spring portion provided between the tip portion and the straight body portion which has significantly smaller thickness than that of the body portion or base portion;

(f) stripping off the photoresist layer;

(g) peeling the conductive substrate having contactors thereon from the dielectric substrate;

(h) placing an adhesive tape on the contactors on the conductive substrate so that upper surfaces of the contactors adhere to the adhesive tape wherein adhesive strength between the contactors and the adhesive tape is larger than that between the contactors and the conductive substrate;

(i) peeling the conductive substrate so that the contactors on the adhesive tape are separated from the conductive substrate; and (j) mounting the contactor on a contact substrate having a through hole in such a way the an end of the contactor is projected from an opposite surface of the contact substrate.

14. A method for producing a contact structure as defined in claim 13, wherein said step of forming the contactors including a step of repeating the steps (b)–(e) to create a difference in the thickness between the spring portion and the straight body portion.

15. A method for producing a contact structure as defined in claim 13, wherein said step of exposing the photoresist layer is a step of exposing the photoresist layer by an electron beam or X-rays through the photo mask.

16. A method for producing a contact structure as defined in claim 13, wherein said step of exposing the photoresist layer is a step of exposing the photoresist layer by an electron beam, X-ray or laser light to directly form the patterns of the image of the contactor on the photoresist layer.

17. A method for producing a contact structure as defined in claim 13, wherein the conductive substrate and the contactors are made of nickel-cobalt (NiCo).

18. A method for producing a contact structure as defined in claim 13, further comprising a step of forming a chrome-inconel layer on the dielectric substrate where the conductive substrate is created on the chrome-inconel layer.

19. A method for producing a contact structure as defined in claim 13, further including a step of forming an conductive layer made of electric conductive material on the sacrificial layer, and a step of forming an adhesion promoter layer between the sacrificial layer and the conductive layer.

20. A method for producing a contact structure as defined in claim 19, wherein the electric conductive material for the conductive layer is different from the electric conductive material for the contactors.

* * * * *